(12) United States Patent
Zhang et al.

(10) Patent No.: US 12,349,298 B2
(45) Date of Patent: Jul. 1, 2025

(54) ROTATING ASSEMBLY, FOLDABLE MECHANISM, AND FOLDABLE TERMINAL

(71) Applicant: HONOR DEVICE CO., LTD., Shenzhen (CN)

(72) Inventors: Yaolei Zhang, Shenzhen (CN); Yilin Lu, Shenzhen (CN); Haifei Li, Shenzhen (CN); Mingqian Gao, Shenzhen (CN); Longlong Gong, Shenzhen (CN); Bin Yan, Shenzhen (CN); Guotong Zhou, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 89 days.

(21) Appl. No.: 18/254,092

(22) PCT Filed: Mar. 3, 2022

(86) PCT No.: PCT/CN2022/079032
§ 371 (c)(1),
(2) Date: May 23, 2023

(87) PCT Pub. No.: WO2022/206276
PCT Pub. Date: Oct. 6, 2022

(65) Prior Publication Data
US 2024/0098915 A1    Mar. 21, 2024

(30) Foreign Application Priority Data

Mar. 29, 2021    (CN) .......................... 202110345736.2

(51) Int. Cl.
*H05K 5/02*    (2006.01)
*E05D 3/06*    (2006.01)
*E05D 11/06*   (2006.01)

(52) U.S. Cl.
CPC ............. *H05K 5/0226* (2013.01); *E05D 3/06* (2013.01); *E05D 11/06* (2013.01); *E05Y 2999/00* (2024.05)

(58) Field of Classification Search
CPC ......... H05K 5/0226; E05D 3/06; E05D 11/06; E05Y 2999/00; H04M 1/0268;
(Continued)

(56) References Cited

U.S. PATENT DOCUMENTS 10,209,743 B1 * 2/2019 Hsu ....................... G06F 1/1681
10,487,550 B2   11/2019 Chu
(Continued)

FOREIGN PATENT DOCUMENTS

CN    201199703 Y    2/2009
CN    107155265 A    9/2017
(Continued)

OTHER PUBLICATIONS

Liu et al., "Stress simulation of foldable OLED screen bending," Chinese Journal of Liquid Crystals and Displays, vol. 33, No. 7, Jul. 2018, 6 pages.

*Primary Examiner* — Anthony M Haughton
*Assistant Examiner* — Theron S Milliser
(74) *Attorney, Agent, or Firm* — Fish & Richardson P.C.

(57) ABSTRACT

This application relates to a rotating assembly, a foldable mechanism, and a foldable terminal, and relates to the field of terminal technologies. The rotating assembly includes a base, a rotating shaft, and a swing arm, where the base is provided with a rotating shaft through-hole and an arc-shaped first slideway, the first slideway and the rotating shaft through-hole communicate with each other, and axes thereof are parallel to each other; the rotating shaft is provided with an arc-shaped second slideway, an axis of the rotating shaft is parallel to an axis of the second slideway, the second (Continued)

slideway runs through the rotating shaft, and a radius of the second slideway is equal to that of the first slideway; the rotating shaft is located in the rotating shaft through-hole, the first slideway and the second slideway can be connected to each other to form a continuous slideway, and the swing arm is located in the continuous slideway and can slide in the continuous slideway.

15 Claims, 13 Drawing Sheets

(58) Field of Classification Search
CPC ..... H04M 1/022; F16C 11/045; G06F 1/1616; G06F 1/1681; G09F 9/301
See application file for complete search history.

(56) References Cited

U.S. PATENT DOCUMENTS

| | | | |
|---|---|---|---|
| 10,664,021 | B1 | 5/2020 | Hsu et al. |
| 11,079,807 | B1* | 8/2021 | Robinson ............... G06F 1/1616 |
| 11,337,321 | B2 | 5/2022 | Jia |
| 11,567,542 | B2* | 1/2023 | Miller .................... F16C 11/04 |
| 2014/0196254 | A1 | 7/2014 | Song |
| 2015/0257290 | A1 | 9/2015 | Lee |
| 2020/0264674 | A1 | 8/2020 | Km et al. |
| 2020/0281085 | A1 | 9/2020 | Jia |
| 2020/0301480 | A1* | 9/2020 | Miller .................. G06F 1/1662 |
| 2020/0383217 | A1 | 12/2020 | Kim et al. |
| 2021/0037662 | A1 | 2/2021 | Wang et al. |
| 2021/0271294 | A1 | 9/2021 | Liao et al. |
| 2021/0289063 | A1 | 9/2021 | Deng et al. |
| 2021/0325941 | A1 | 10/2021 | Hou et al. |
| 2022/0174830 | A1 | 6/2022 | Li et al. |
| 2022/0261040 | A1 | 8/2022 | Liu et al. |
| 2024/0098915 | A1* | 3/2024 | Zhang .................. H05K 5/0226 |
| 2024/0357025 | A1* | 10/2024 | Zhang ................. H04M 1/0268 |

FOREIGN PATENT DOCUMENTS

| | | |
|---|---|---|
| CN | 107578707 A | 1/2018 |
| CN | 108769317 A | 11/2018 |
| CN | 109451112 A | 3/2019 |
| CN | 110213463 A | 9/2019 |
| CN | 110430294 A | 11/2019 |
| CN | 210041901 U | 2/2020 |
| CN | 111692196 A | 9/2020 |
| CN | 112081815 A | 12/2020 |
| CN | 112153188 A | 12/2020 |
| CN | 112306149 A | 2/2021 |
| CN | 212486550 U | 2/2021 |
| CN | 112443562 A | 3/2021 |
| CN | 113888960 A | 1/2022 |
| EP | 3702881 A1 | 9/2020 |
| JP | 2018132129 A | 8/2018 |
| JP | 2020027246 A | 2/2020 |
| WO | 2018082338 A1 | 5/2018 |
| WO | 2020258887 A1 | 12/2020 |
| WO | 2021017959 A1 | 2/2021 |

* cited by examiner

ROTATING ASSEMBLY, FOLDABLE MECHANISM, AND FOLDABLE TERMINAL

CROSS-REFERENCE TO RELATED APPLICATIONS

This application is a national stage of International Application No. PCT/CN2022/079032, filed on Mar. 3, 2022, which claims priority to Chinese Patent Application No. 202110345736.2, filed on Mar. 29, 2021. The disclosures of the aforementioned applications are hereby incorporated by reference in their entireties.

TECHNICAL FIELD

This application relates to the field of terminal technologies, and in particular, to a rotating assembly, a foldable mechanism, and a foldable terminal.

BACKGROUND

With development of terminal technologies, a terminal is increasingly extensively used, and has become one of the most important tools in people's daily work and life. A foldable terminal is gradually favored by people because of a small occupied space and high portability.

The foldable terminal performs a folding function mainly by using a foldable mechanism, and a main component of the foldable mechanism is a rotating assembly. The rotating assembly mainly includes a base, a rotating shaft, and a swing arm. The swing arm is rotatably connected to the base by using the rotating shaft. When the swing arm of the rotating assembly rotates relative to the base, the foldable mechanism is enabled to be folded.

Then, when the foldable mechanism is applied to the foldable terminal, two sides of the foldable mechanism are connected to two bodies of the foldable terminal respectively. When a user moves the bodies, the swing arm can rotate around the rotating shaft, and a screen of the foldable terminal is bent at a position corresponding to the foldable mechanism. After the two bodies of the foldable terminal are folded in half, the screen forms a semicircular structure at the position corresponding to the foldable mechanism, and a radius of this semicircular structure may be referred to as a bending radius of the screen. Although the screen can be bent, the screen has poor tensile elasticity. Therefore, to protect the screen, the bending radius of the screen is usually relatively large.

Because a rotation radius of the swing arm is related to the bending radius of the screen, when the bending radius of the screen is relatively large, the rotation radius of the swing arm also needs to be relatively large. As a result, a rotating assembly is relatively long and occupies a relatively large space in the foldable mechanism, the foldable mechanism is also relatively long, and then the foldable mechanism occupies a relatively large space in the foldable terminal.

SUMMARY

This application provides a rotating assembly, a foldable mechanism, and a foldable terminal, to overcome the problems with related technologies. The technical solutions are as follows.

According to an aspect, this application provides a rotating assembly, where the rotating assembly includes a base, a rotating shaft, and a swing arm;

the base is provided with a rotating shaft through-hole and an arc-shaped first slideway, an end of the first slideway communicates with the rotating shaft through-hole, an axis of the first slideway is parallel to an axis of the rotating shaft through-hole, the rotating shaft is provided with an arc-shaped second slideway, an axis of the rotating shaft is parallel to an axis of the second slideway, the second slideway runs through the rotating shaft, and a radius of the second slideway is equal to that of the first slideway;

the rotating shaft is located in the rotating shaft through-hole, and the first slideway and the second slideway can be connected to each other to form a continuous slideway, and the swing arm is located in the continuous slideway and is slidable in the continuous slideway; and the swing arm is configured to slide in the continuous slideway when the swing arm rotates in a first angle range, and drive the rotating shaft to rotate when the swing arm rotates in a second angle range, where a rotation radius of the swing arm in the first angle range is greater than that in the second angle range.

When a foldable mechanism with the rotating assembly is applied to a foldable terminal, the swing arm of the rotating assembly can switch a rotation axis and the rotation radius throughout the rotation, and the rotation radius in the first angle range is greater than that in the second angle range. A large rotation radius in the first angle range makes the swing arm rotate relatively gently, which can reduce a pulling force on the screen from flattening to folding, thereby protecting the screen. A small rotation radius in the second angle range can reduce a size of the rotating assembly.

In addition, the reduction of the size of the rotating assembly can reduce the space in the foldable mechanism that is occupied by the rotating assembly, thereby reducing the size of the foldable mechanism. Once the size of the foldable mechanism is reduced, the space in the foldable terminal that is occupied by the foldable mechanism can be reduced, thereby reducing the size of the foldable terminal, so that the size of the foldable terminal can be minimized on the basis of meeting folding requirements.

In a possible implementation, the swing arm includes a body connecting portion, a sliding portion, and a locking portion, where the body connecting portion, the sliding portion, and the locking portion are sequentially connected, and the locking portion is located on a side portion of the sliding portion and far away from an end portion of the body connecting portion; and the sliding portion and the locking portion each have an arc-shaped structure, the sliding portion fits with the continuous slideway, and the locking portion fits with the second slideway.

In an example, the sliding portion and the locking portion each have an arc-shaped structure and fit with the continuous slideway, and the sliding portion and the locking portion can be inserted in the continuous slideway and slide in the continuous slideway.

In a possible implementation, when a rotation angle of the swing arm is a minimum angle of the first angle range, an end portion that is of the locking portion and that is far away from the body connecting portion is in contact with an end portion that is of the first slideway and that is far away from the second slideway; or when the rotation angle of the swing arm is a maximum angle of the first angle range, the locking portion is located in the second slideway, and an end portion that is of the locking portion and that is close to the body connecting portion is in contact with an end portion that is of the second slideway and that is far away from the first slideway.

In this way, during rotation of the swing arm from the maximum angle to the minimum angle of the first angle range, the end portion that is of the locking portion and that is far away from the body connecting portion is in contact with the end portion that is of the first slideway and that is far away from the second slideway, so that the swing arm can be restrained from continuing to slide in an original direction in the continuous slideway.

During rotation of the swing arm from the minimum angle to the maximum angle in the first angle range, the end portion that is of the locking portion and that is close to the body connecting portion is in contact with the end portion that is of the second slideway and that is far away from the first slideway, so that the swing arm can be restrained from continuing to slide in the original direction in the continuous slideway.

During rotation of the swing arm from a maximum angle to a minimum angle in the second angle range, contact between a first limiting platform and a second limiting platform can restrain the rotating shaft from rotating in the original direction in the rotating shaft through-hole.

As for manners for restraining the rotating shaft from rotating in the original direction in the rotating shaft through-hole during the rotation of the swing arm from the minimum angle to the maximum angle in the second angle range, one manner may be implemented through contact between swing arms on two sides of the base, another manner may be implemented through contact between a third limiting platform and the locking portion, and still another manner may be implemented through contact between the third limiting platform and a fourth limiting platform.

In a possible implementation, an arc length of the locking portion is less than that of the second slideway.

In an example, the arc length of the locking portion is less than that of the second slideway, to make the locking portion completely located in the second slideway, so that when the locking portion is driving the rotating shaft to rotate, the end portion that is of the locking portion and that is far away from the body connecting portion does not interfere with the rotation of the locking portion with the rotating shaft.

In a possible implementation, an inner wall of the rotating shaft through-hole is provided with the first limiting platform, an outer surface of the rotating shaft is provided with the second limiting platform, and the second limiting platform and the first limiting platform are located in a same circumferential direction; and when the rotation angle of the swing arm is a minimum angle of the second angle range, the first limiting platform is in contact with the second limiting platform, and the first slideway and the second slideway can be connected to each other to form the continuous slideway.

In an example, during rotation of the swing arm from the maximum angle to the minimum angle in the second angle range, the contact between the first limiting platform and the second limiting platform can restrain the rotating shaft from rotating in the original direction in the rotating shaft through-hole, so that the first slideway and the second slideway are connected to form the continuous slideway for the swing arm to slide along the continuous slideway in a subsequent process.

In a possible implementation, the inner wall of the rotating shaft through-hole is provided with the third limiting platform; and the third limiting platform is configured in such a way that the third limiting platform restrains the swing arm from rotating in an original direction when the rotation angle of the swing arm changes from the minimum angle of the second angle range to a maximum angle of the second angle range.

In a possible implementation, when the rotation angle of the swing arm is the maximum angle of the second angle range, the third limiting platform is in contact with the swing arm.

In this way, during the rotation of the swing arm from the minimum angle to the maximum angle in the second angle range, the contact between the third limiting platform and the swing arm can restrain the rotating shaft from rotating in the original direction in the rotating shaft through-hole.

In a possible implementation, the outer surface of the rotating shaft is provided with the fourth limiting platform, and the fourth limiting platform and the third limiting platform are located in a same circumferential direction;

an arc length distance between the third limiting platform and the fourth limiting platform is greater than or equal to an arc length distance between the third limiting platform and the swing arm; and when the rotation angle of the swing arm is the maximum angle of the second angle range, the third limiting platform is in contact with the fourth limiting platform.

In this way, during the rotation of the swing arm from the minimum angle to the maximum angle in the second angle range, the contact between the third limiting platform and the fourth limiting platform can restrain the rotating shaft from rotating in the original direction in the rotating shaft through-hole.

In a possible implementation, the first slideway is located at a position that is in the rotating shaft through-hole and that is far away from the swing arm.

In an example, to make the swing arm first rotate in the first angle range and then rotate in the second angle range, correspondingly, the first slideway is located at a position that is in the rotating shaft through-hole and that is far away from the swing arm. In this way, during the rotation from the minimum rotation angle to the maximum rotation angle, the swing arm can first rotate in the first angle range and then rotate in the second angle range.

In a possible implementation, the rotating shaft includes an assembly column and two support columns;

the assembly column is located between the two support columns, the assembly column and the two support columns are coaxial, and the second slideway runs through the assembly column;

the rotating shaft through-hole includes a first-section through-hole and two second-section through-holes, where the first-section through-hole matches the assembly column, and the second-section through-holes match the support columns; and the assembly column is located in the first-section through-hole, and the support columns are located in the second-section through-holes.

In this way, the second slideway, the second limiting platform, and the fourth limiting platform of the rotating shaft are all arranged on the assembly column, and the assembly column is configured to implement assembly with the swing arm. The support columns are configured to implement assembly with the base, a cross-section of each of the support columns may be circular, and the support columns with circular cross-sections are located in the second-section through-holes with circular cross-sections, so that the rotating shaft can smoothly rotate in the rotating shaft through-hole.

In a possible implementation, two rotating shaft and two swing arms are provided;

a first side portion and a second side portion of the base are each provided with the rotating shaft through-hole and the first slideway;

the two rotating shafts are located in the rotating shaft through-hole of the first side portion and the rotating shaft through-hole of the second side portion respectively; and the two swing arms are located in the continuous slideway of the first side portion and the continuous slideway of the second side portion respectively.

In an example, when the rotating assembly is applied to a foldable terminal, the swing arm installed on the first side portion is connected to one body of the foldable terminal, and the swing arm installed on the second side portion is connected to the other body of the foldable terminal, to implement a folding function of the foldable terminal.

In a possible implementation, the maximum angle of the first angle range is equal to the minimum angle of the second angle range.

The maximum angle of the first angle range is equal to the minimum angle of the second angle range, so that the two angle ranges are connected.

According to another aspect, a foldable mechanism is provided, where the foldable mechanism includes a door plate and the foregoing rotating assembly; and the door plate is located on a surface of the body connecting portion of the swing arm, and is configured to support a screen of a foldable terminal at which the foldable mechanism is located.

In an example, after the rotating shaft and the swing arm are assembled in the base, the door plate may be laid on a surface of the body connecting portion of the swing arm, the door plate is rotably connected to the body connecting portion of the swing arm, and a surface that is of the body connecting portion of the swing arm and that faces away from the door plate is used to fixedly connect the body.

In a possible implementation, the foldable mechanism further includes a fastener, a limiting pin, a connecting plate, and a connecting shaft, where the fastener is located on an end portion of the base of the rotating assembly;

the limiting pin is located on a surface of the door plate, and a distance is reserved between the limiting pin and the door plate; and one side of the connecting plate is connected to the fastener by using the connecting shaft, the other side of the connecting plate is inserted between the limiting pin and the door plate, and the connecting plate is slidable in a direction perpendicular to the connecting shaft relative to the door plate.

In an example, when the swing arm is switched from driving the rotating shaft to rotate to sliding in the continuous slideway, the rotation radius of the swing arm becomes larger, and the connecting plate slides in a direction away from the door plate to increase the rotation radius of the door plate, so as to adapt to the increase of the rotation radius of the swing arm. When the swing arm is switched from sliding in the continuous slideway to driving the rotating shaft to rotate, the rotation radius of the swing arm becomes smaller, and the connecting plate slides in a direction close to the door plate to reduce the rotation radius of the door plate, so as to adapt to the reduction of the rotation radius of the swing arm.

It can be learned that during rotation of the swing arm, the door plate rotates around the connecting shaft under the driving of the connecting plate, to rotate with the swing arm. When the swing arm switches the rotation radius, the connecting plate slides left and right relative to the door plate to adjust the rotation radius of the door plate to adapt to a change in the rotation radius of the swing arm, so that the door plate does not interfere with the movement of the swing arm during the rotation of the swing arm.

According to another aspect, a foldable terminal is further provided, where the foldable terminal includes a first body, a second body, a screen, and the foregoing foldable mechanism; and the foldable mechanism is connected between the first body and the second body, and the screen is located on surfaces of the first body, the second body, and the foldable mechanism, and is fastened to the first body and the second body.

When the foldable mechanism with the rotating assembly is applied to the foldable terminal, when rotating in a first angle range, a swing arm of the rotating assembly slides in a continuous slideway, and moves, relative to a base, circularly around a center of a circle where a first slideway is located; and when rotating in a second angle range, the swing arm drives a rotating shaft to rotate, and moves circularly around an axis of the rotating shaft relative to the base, and a rotation radius of the swing arm in the first angle range is greater than that in the second angle range. It can be learned that the swing arm of the rotating assembly can switch a rotation axis and the rotation radius during the entire rotation, and the rotation radius of the swing arm in the first angle range is large, so that the swing arm rotates relatively gently in the first angle range, which can reduce a pulling force on the screen from flattening to bending, thereby protecting the screen. The swing arm has a small rotation radius in the second angle range, which can reduce a length of the rotating assembly, and then reduce a space in the foldable mechanism that is occupied by the rotating assembly, and reduce a size of the foldable mechanism, thereby reducing a space in the foldable terminal that is occupied by the foldable mechanism.

In addition, the reduction of the space in the foldable terminal that is occupied by the foldable mechanism can further reduce a size of the foldable terminal, so that the size of the foldable terminal can be minimized on the basis of meeting folding requirements.

It should be understood that the foregoing general descriptions and the following detailed descriptions are only examples and are explanatory, and cannot limit this application.

BRIEF DESCRIPTION OF DRAWINGS

The accompanying drawings herein are incorporated into the specification and constitute a part of the specification, illustrate embodiments that conform to this application, and are used together with the specification to explain the principles of this application. In the drawings.

DESCRIPTIONS OF REFERENCE NUMERALS

10. Foldable mechanism; 20. First body; 30. Second body; 40. Screen;
101. Rotating assembly; 102. Door plate; 103. Fastener; 104. Limiting pin; 105. Connecting plate; 106. Connecting shaft;
1. Base; 11. Rotating shaft through-hole; 12. First slideway; 13. First side portion; 14. Second side portion; 111. First limiting platform; 112. Third limiting platform; 113. First-section through-hole; 114. Second-section through-hole;
2. Rotating shaft; 21. Second slideway; 22. Second limiting platform; 23. Fourth limiting platform; 24. Assembly column; 25. Support column;
3. Swing arm; 31. Body connecting portion; 32. Sliding portion; 33. Locking portion; 22'. Projection of the second limiting platform; 23'. Projection of the fourth limiting platform; 111'. Projection of the first limiting platform.

Description of Embodiments

Example embodiments are described in detail herein, and examples thereof are shown in the accompanying drawings. When the accompanying drawings are involved in the following description, unless otherwise indicated, the same numerals in different accompanying drawings indicate the same or similar elements. The implementations described in the following example embodiments do not represent all the implementations consistent with this application. On the contrary, the implementations are only examples of apparatuses and methods consistent with some aspects of this application as detailed in the appended claims.

Figure 1:
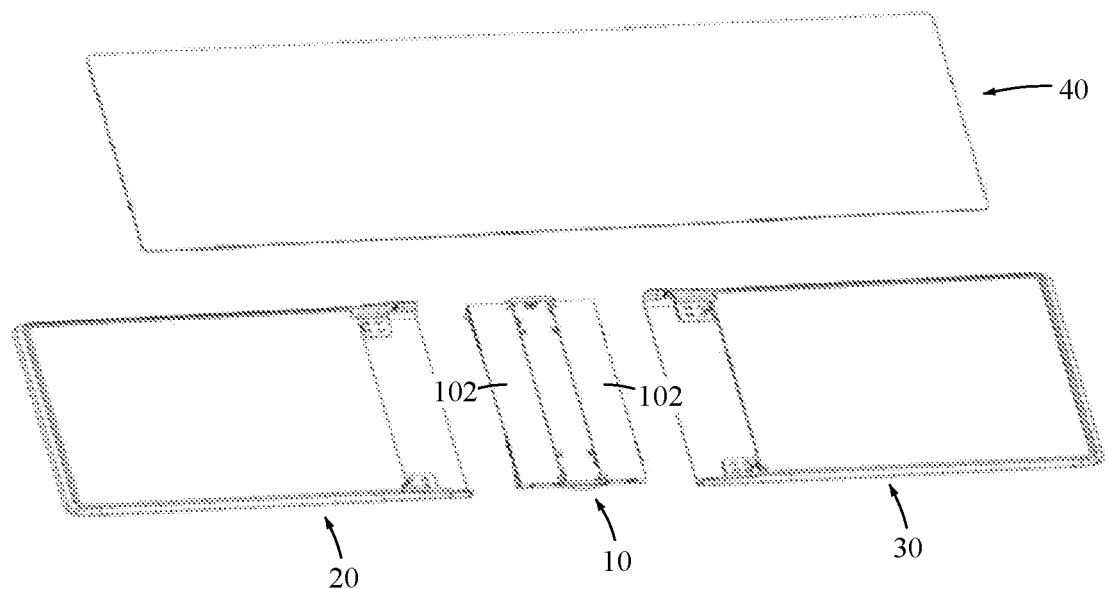
FIG. 1 is a schematic exploded view of a structure of a foldable terminal according to an embodiment.

FIG. 1 is a schematic exploded view of a structure of a foldable terminal according to an embodiment of this application. Although a mobile phone is used as an example in FIG. 1, it can be understood that the foldable terminal is not limited to a mobile phone, but may alternatively be a tablet computer, a display, or the like.

As shown in FIG. 1, the foldable terminal includes a foldable mechanism 10, a first body 20, a second body 30, and a screen 40. As shown in FIG. 1 and referring to FIG. 2, the foldable mechanism 10 is located between the first body 20 and the second body 30, one side of the foldable mechanism 10 is connected to the first body 20, and the other side of the foldable mechanism 10 is connected to the second body 30. The screen 40 is located on surfaces of the first body 20, the second body 30, and the foldable mechanism 10, and the screen 40 is fastened to the first body 20 and the second body 30. The screen 40 is a flexible screen that can be bent.

Figure 2:
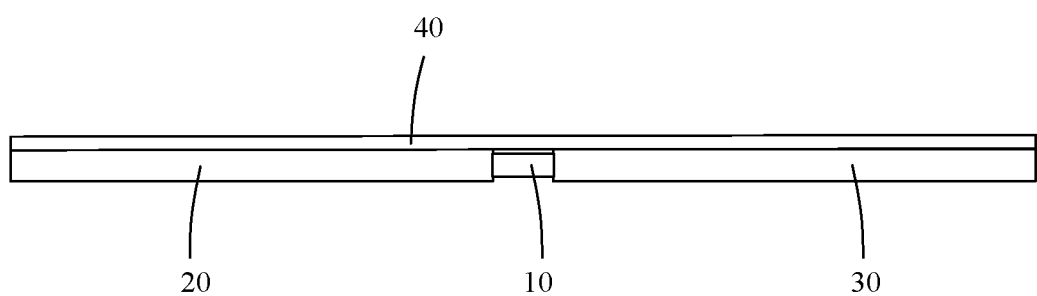
FIG. 2 is a schematic diagram of a structure of a foldable terminal in a flattened state according to an embodiment.
Figure 3:
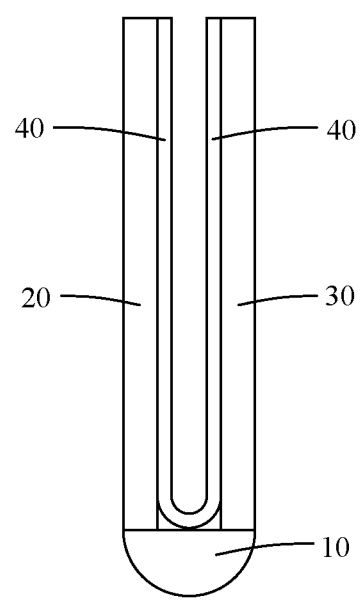
FIG. 3 is a schematic diagram of a structure of a foldable terminal in a state of being folded in half according to an embodiment.

The foldable terminal can be folded and bent under an action of the foldable mechanism 10, to implement flattening and folding in half. FIG. 2 is a schematic diagram of a structure of the foldable terminal in a flattened state. A first body 20 and a second body 30 are roughly located in a same plane, and a screen 40 is laid on surfaces of the first body 20, a foldable mechanism 10, and the second body 30. FIG. 3 is a schematic diagram of a structure of the foldable terminal in a state of being folded in half. A first body 20 and a second body 30 are roughly parallel to each other, and a screen 40 is folded in a space enclosed by the first body 20, a foldable mechanism 10, and the second body 30.

Figure 4:
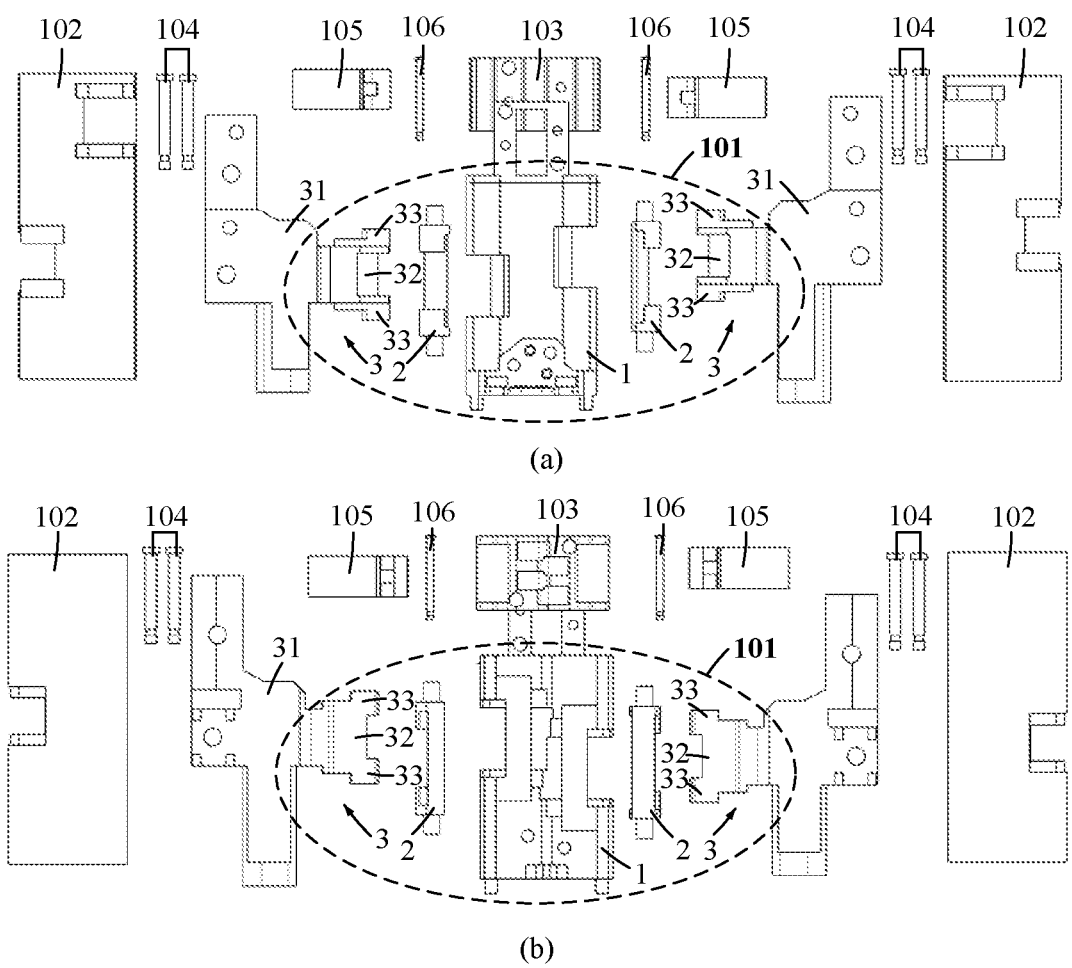
FIG. 4 is a schematic exploded view of a structure of a foldable mechanism according to an embodiment.
Figure 5:
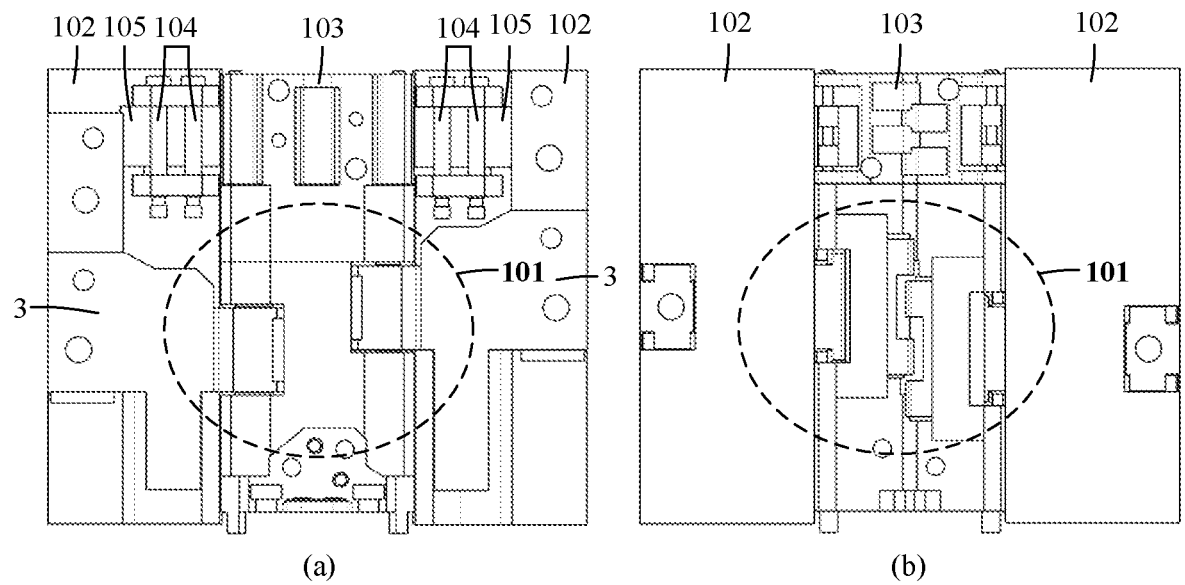
FIG. 5 is a schematic diagram of an assembled structure of a foldable mechanism according to an embodiment.

For a specific structure of the foldable mechanism 10, refer to FIG. 4 and FIG. 5. FIG. 4 is a schematic exploded view of a structure of a foldable mechanism 10, where (a) in FIG. 4 is a schematic exploded view of a structure of the foldable mechanism 10 with a first surface upward, and (b) in FIG. 4 is a schematic exploded view of a structure of the foldable mechanism 10 with a second surface upward. A position of the first surface is opposite to a position of the second surface, for example, the first surface is a back surface of the foldable mechanism, and the second surface is a front surface of the foldable structure.

FIG. 5 is a schematic diagram of an assembled structure of a foldable mechanism 10, where (a) in FIG. 5 corresponds to (a) in FIG. 4 and is a schematic diagram of an assembled structure of a foldable mechanism 10 with a first surface upward, and (b) in FIG. 5 corresponds to (b) in FIG. 4 and is a schematic diagram of an assembled structure of a foldable mechanism 10 with a second surface upward.

As shown in FIG. 4, the folding structure 10 includes a rotating assembly 101 and a door plate 102, where the rotating assembly 101 is a core assembly of the foldable mechanism 10 to achieve a folding function thereof. As shown in FIG. 4 and referring to FIG. 5, the rotating assembly 101 includes a base 1, rotating shafts 2, and swing arms 3, where a rotating shaft 2 and a swing arm 3 are installed on one side of the base 1, and a rotating shaft 2 and a swing arm 3 are also installed on the other side of the base 1. As shown in (a) in FIG. 5, a part of the swing arm 3 is installed in the base 1, and the other part thereof extends out of the base 1.

As shown in FIG. 4 and referring to FIG. 5, the door plate 102 is located on a surface of the swing arm 3. For example, as shown in FIG. 5, the door plate 102 is located on a surface of the part that is of the swing arm 3 and that extends out of the base 1. As shown in FIG. 1, the door plate 102 is configured to support the screen 40.

When the foldable mechanism 10 is applied to a foldable terminal, as shown in FIG. 5 and referring to FIG. 1, a surface that is of the swing arm 3 on one side of the foldable mechanism 10 and that faces away from the door plate 102 is connected to the first body 20, a surface that is of the swing arm 3 on the other side of the foldable mechanism 10 and that faces away from the door plate 102 is connected to the second body 30, and the screen 40 is located on surfaces of the first body 20, the door plate 102 of the foldable mechanism 10, and the second body 30.

The foldable terminal performs the folding function under the action of the foldable mechanism, and a key component of the foldable mechanism is the rotating assembly 101 that can rotate. The rotating assembly 101 is described in detail below.

Figure 6:
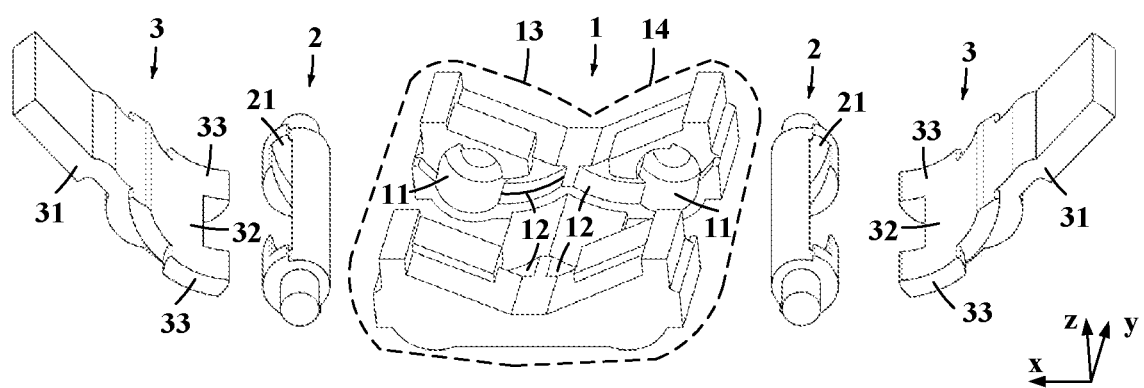
FIG. 6 is a schematic exploded view of a structure of a rotating assembly according to an embodiment.
Figure 7:
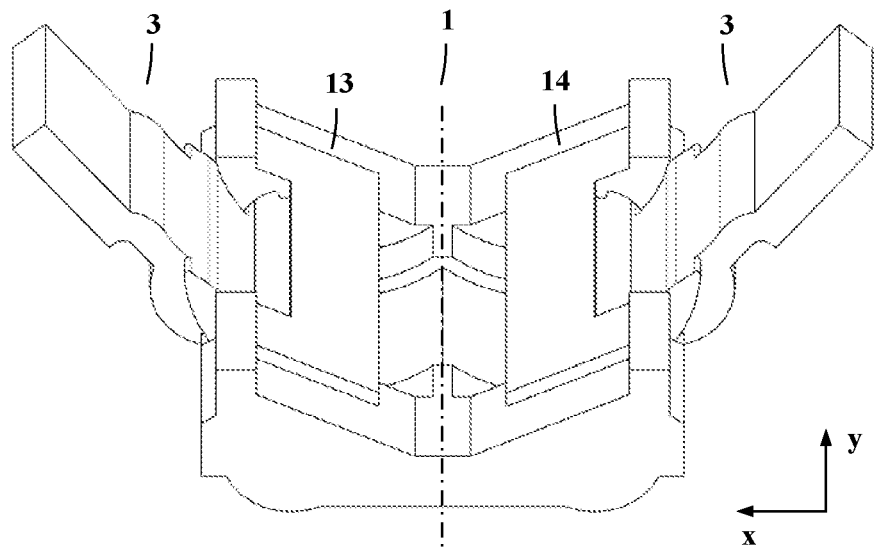
FIG. 7 is a schematic diagram of an assembled structure of a rotating assembly according to an embodiment.

FIG. 6 is a schematic exploded view of a structure of the rotating assembly 101. FIG. 7 is a schematic diagram of an assembled structure of the rotating assembly 101. As shown in FIG. 6, the rotating assembly includes a base 1, a rotating shaft 2, and a swing arm 3, where the swing arm 3 shown in FIG. 6 and FIG. 7 is a part of the swing arm 3 in FIG. 4, the swing arm 3 shown in subsequent figures is also a part of the swing arm 3 in FIG. 4, and this part is used to assemble with the rotating shaft 2 and the base 1.

As shown in FIG. 6 and referring to FIG. 7, both the rotating shaft 2 and the swing arm 3 are installed in the base 1, and both the rotating shaft 2 and the swing arm 3 can rotate relative to the base 1. When rotating, the swing arm 3 can drive the body connected thereto to rotate, thereby implementing a bending function of the foldable mechanism.

As shown in FIG. 6, the rotating assembly is a double swing arm type rotating assembly, with two rotating shafts 2 and two swing arms 3, one rotating shaft 2 and one swing arm 3 are installed on a first side portion 13 of the base 1, and the other rotating shaft 2 and the other swing arm 3 are installed on a second side portion 14 of the base 1. In this solution, as shown in FIG. 7, a position of the swing arm 3 located on the first side portion 13 and a position of the swing arm 3 located on the second side portion 14 are symmetrical with respect to a central line of the base 1. This design can reduce a size of the rotating assembly in an axial direction. That is, as shown in FIG. 7, this design can reduce a length of the rotating assembly in a y-axis.

Figure 8:
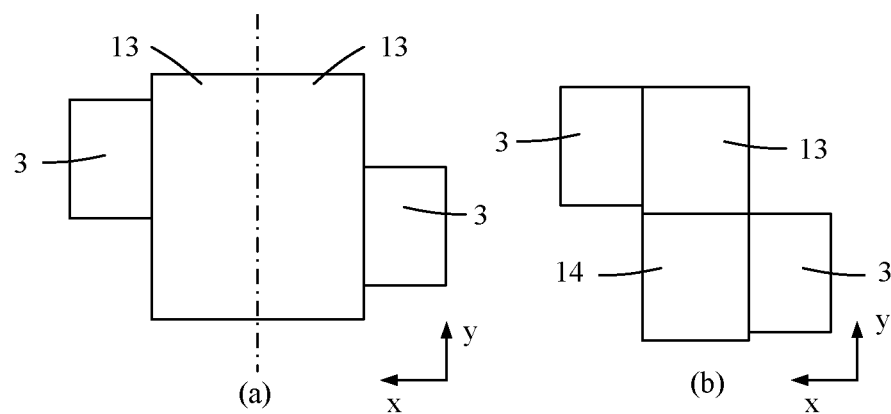
FIG. 8 is a schematic diagram of arrangement positions of swing arms according to an embodiment.

Certainly, for the double swing arm type rotating assembly, the two swing arms 3 located on different sides of the base 1 may not be symmetrical with each other. For example, as shown in (a) in FIG. 8, a first side portion 13 and a second side portion 14 of a base 1 are still distributed left and right, but one swing arm 3 is located at an upper position of the first side portion 13, and the other swing arm 3 is located at a lower position of the second side portion 14. For another example, as shown in (b) in FIG. 8, the first side portion 13 and the second side portion 14 of the base 1 are vertically distributed, but the swing arm 3 located on the first side portion 13 and the swing arm 3 located on the second side portion 14 are staggered. The staggering of the two swing arms 3 located on different sides of the base 1 can reduce the size in the axial direction perpendicular to the rotating assembly. That is, as shown in (b) in FIG. 8, the design can reduce a length of the rotating assembly in an x-axis direction.

In the solution in which the rotating assembly includes two swing arms 3 and two rotating shafts 2, a positional relationship between the two swing arms 3 located on different sides of the base 1 is not limited in this embodiment, and may be flexibly selected based on an actual situation.

When the double swing arm type rotating assembly is applied to a foldable terminal, as shown in FIG. 5 and referring to FIG. 1, the swing arm 3 on the first side portion 13 of the base 1 may be connected to the first body 20, and the swing arm 3 on the second side portion 14 of the base 1 may be connected to the second body 30, so that when the two swing arms 3 rotate, the first body 20 and the second body 30 can be bent at the foldable mechanism 10.

In the foregoing case, the rotating assembly is a double swing arm type rotating assembly. However, in some other examples, the rotating assembly may alternatively be a single swing arm type rotating assembly, where one rotating shaft 2 and one swing arm 3 are provided, and the rotating shaft 2 and the swing arm 3 are installed on the first side portion 13 or the second side portion 14 of the base 1.

When the single swing arm type rotating assembly is applied to a foldable terminal, the swing arm 3 on one side of the base 1 may be connected to the first body 20, and the other side portion of the base 1 may be connected to the second body 30, so that when the swing arm 3 drives the first body 20 to rotate, the first body 20 may be bent relative to the second body 30.

Figure 9:
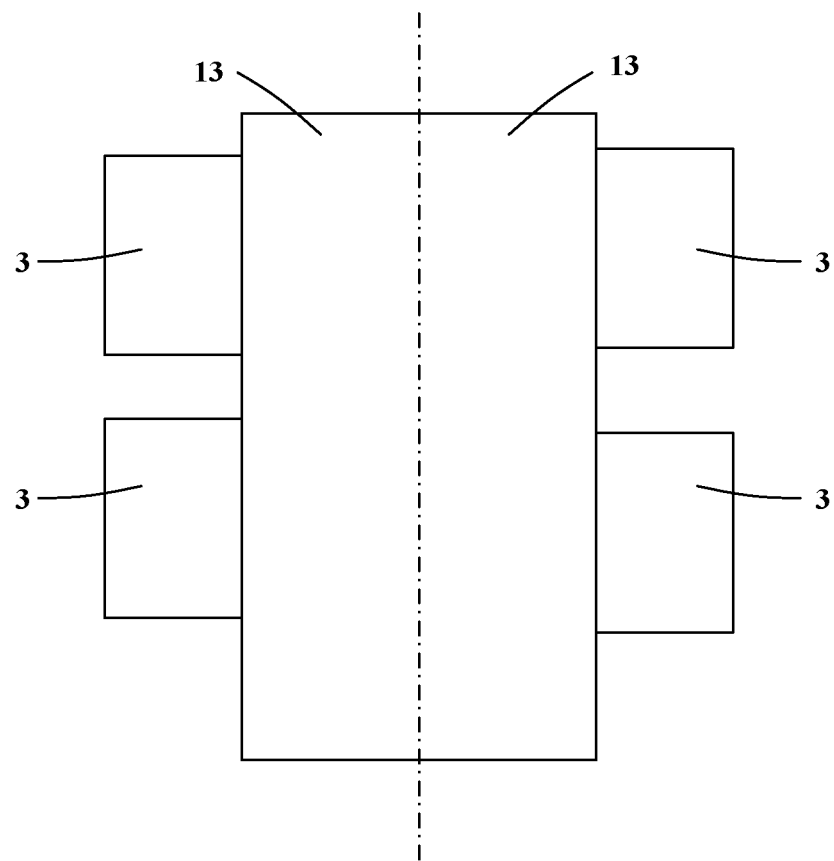
FIG. 9 is a schematic diagram of arrangement positions of swing arms according to an embodiment.

Certainly, in some other examples, as shown in FIG. 9, the rotating assembly may alternatively be a multi-swing arm type rotating assembly, and two or more rotating shafts 2 and two or more swing arms 3 are provided. As shown in FIG. 9, a plurality of rotating shafts 2 and a plurality of swing arms 3 are installed on a first side portion 13 of a base 1, a plurality of rotating shafts 2 and a plurality of swing arms 3 are installed on a second side portion 14 of the base 1, and a quantity of the swing arms 3 at the first side portion 13 may be equal or unequal to a quantity of the swing arms 3 at the second side portion 14.

When the multi-swing arm type rotating assembly is applied to a foldable terminal, the plurality of swing arms 3 at the first side portion 13 of the base 1 are connected to the first body 20, and the plurality of swing arms 3 at the second side portion 14 of the base 1 are connected to the second body 30, so that when the swing arms 3 on the two sides of the base 1 rotate, the first body 20 and the second body 30 can be bent at the foldable mechanism 10.

Figure 10:
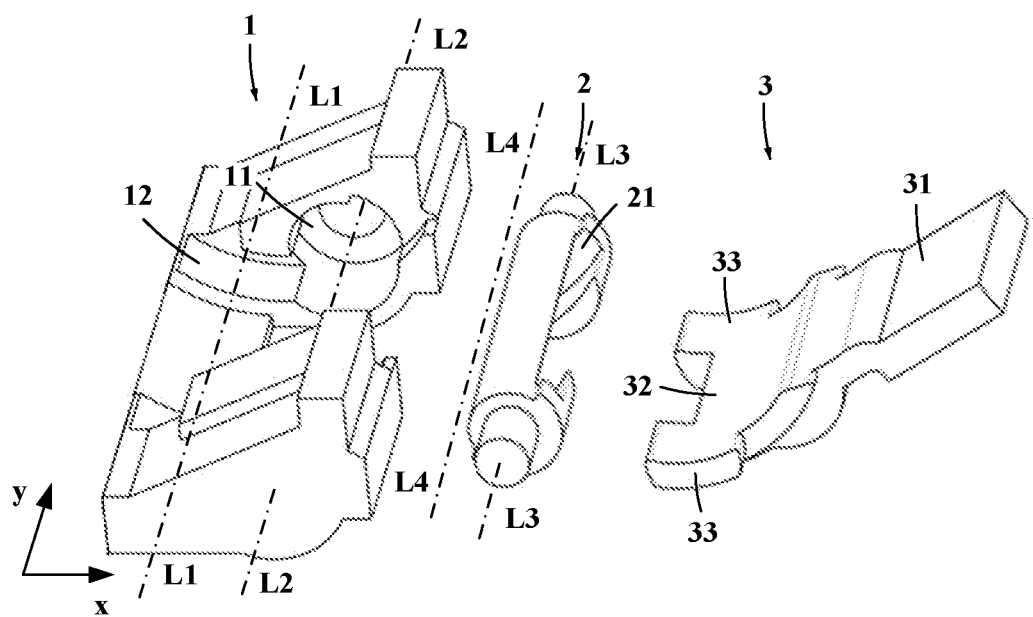
FIG. 10 is a schematic exploded view of a structure of a rotating assembly according to an embodiment.

Regardless of how many swing arms 3 are included in the rotating assembly, a specific structure of each rotating shaft 2, a specific structure of each swing arm 3, and installation relationships between each rotating shaft 2 and the base 1 and between each swing arm 3 and the base 1 are roughly the same, and the rotating shaft 2 and the swing arm 3 on one side (for example, on the right side) of the base 1 may be used as an example for description, as shown in FIG. 10.

An example in which the rotating shaft 2 and the swing arm 3 are installed on the second side portion 14 of the base 1 shown in FIG. 10 is used below for description, and a case where the rotating shaft 2 and the swing arm 3 are installed on the first side portion 13 of the base 1 is similar thereto, and therefore details are not described again.

FIG. 10 is a schematic exploded view of a partial structure of a rotating assembly. As shown in FIG. 10 and referring to FIG. 11, a base 1 is provided with a rotating shaft through-hole 11 and an arc-shaped first slideway 12. As shown in FIG. 10, the first slideway 12 is located at a position of the rotating shaft through-hole 11 far away from a swing arm 3. As shown in FIG. 10 and referring to FIG. 11, one end of the first slideway 12 communicates with the rotating shaft through-hole 11, an axis L1 of the first slideway 12 is parallel to an axis L2 of the rotating shaft through-hole 11, and one end of the first slideway 12 is an end portion in a sliding direction.

Figure 11:
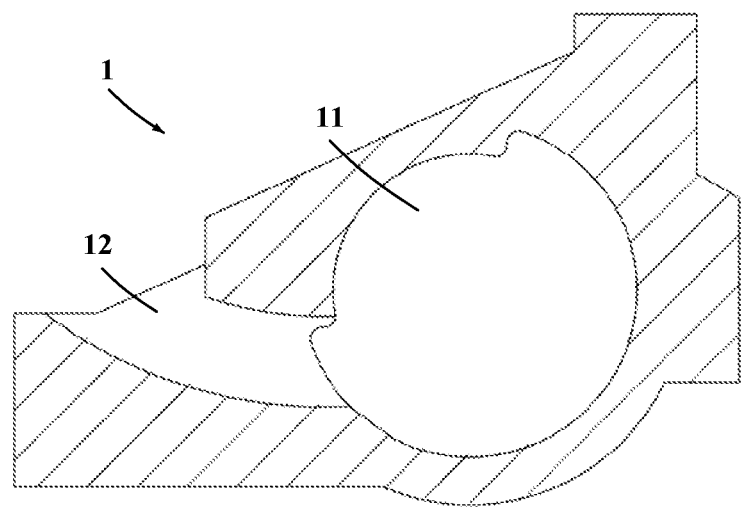
FIG. 11 is a schematic diagram of a cross-section of a base taken at a rotating shaft through-hole and a first slideway according to an embodiment.

As shown in FIG. 10 and referring to FIG. 11, the axis L2 of the rotating shaft through-hole 11 is a straight line passing through a center of the rotating shaft through-hole 11 and in an axial direction. As shown in FIG. 10 and referring to FIG. 11, the axis L1 of the first slideway 12 is a central line of a circle where the arc-shaped first slideway 12 is located.

It should be noted that a quantity of rotating shaft through-holes 11 is related to a quantity of rotating shaft 2, and a quantity of first slideways 12 is related to a quantity of swing arms 3. For example, as shown in FIG. 6, for a double swing arm type rotating assembly, two rotating shafts 2 and two swing arms 3 are provided. Then the first side portion 13 and the second side portion 14 of the base 1 are each provided with a rotating shaft through-hole 11 and a first slideway 12. As shown in FIG. 6, the first slideway 12 of the first side portion 13 is adjacent to the first slideway 12 of the second side portion 14. In this way, in subsequent assembly, the two rotating shafts are located in the rotating shaft through-hole 11 of the first side portion 13 and the rotating shaft through-hole of the second side portion 14 respectively, and the two swing arms 3 are located in a continuous slideway 12-21 of the first side portion 13 and a continuous slideway 12-21 of the second side portion 14 respectively.

Figure 12:
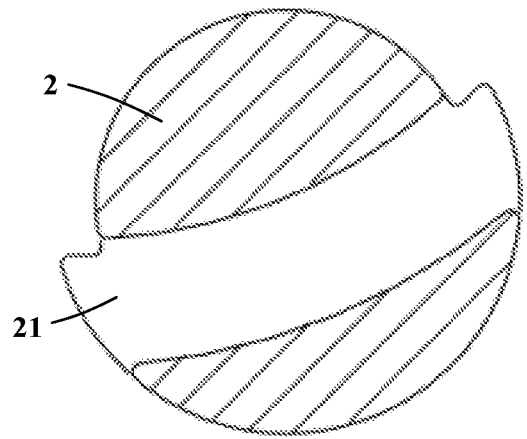
FIG. 12 is a schematic diagram of a cross-section of a rotating shaft taken at a second slideway according to an embodiment.

As shown in FIG. 10 and referring to FIG. 12, the rotating shaft 2 is provided with an arc-shaped second slideway 21, and an axis L3 of the rotating shaft 2 is parallel to an axis L4 of the second slideway 21. As shown in FIG. 10 and referring to FIG. 12, the axis L3 of the rotating shaft 2 is a straight line passing through a center of the rotating shaft 2 and in an axial direction. The axis L4 of the second slideway 21 is a central line of a circle where the arc-shaped second slideway 21 is located.

It should be noted that, as shown in FIG. 10, the axis L1 of the first slideway 12, the axis L2 of the rotating shaft through-hole, the axis L3 of the rotating shaft 2, and the axis L4 of the second slideway 21 are theoretically parallel to each other.

As shown in FIG. 10 and referring to FIG. 12, the second slideway 21 runs through the rotating shaft 2, where the second slideway 21 runs through the rotating shaft 2, that is, as shown in FIG. 12, one end of the second slideway 21 is located at an outer surface of the rotating shaft 2, and the other end of the second slideway 21 is also located at the outer surface of the rotating shaft 2.

Figure 13:
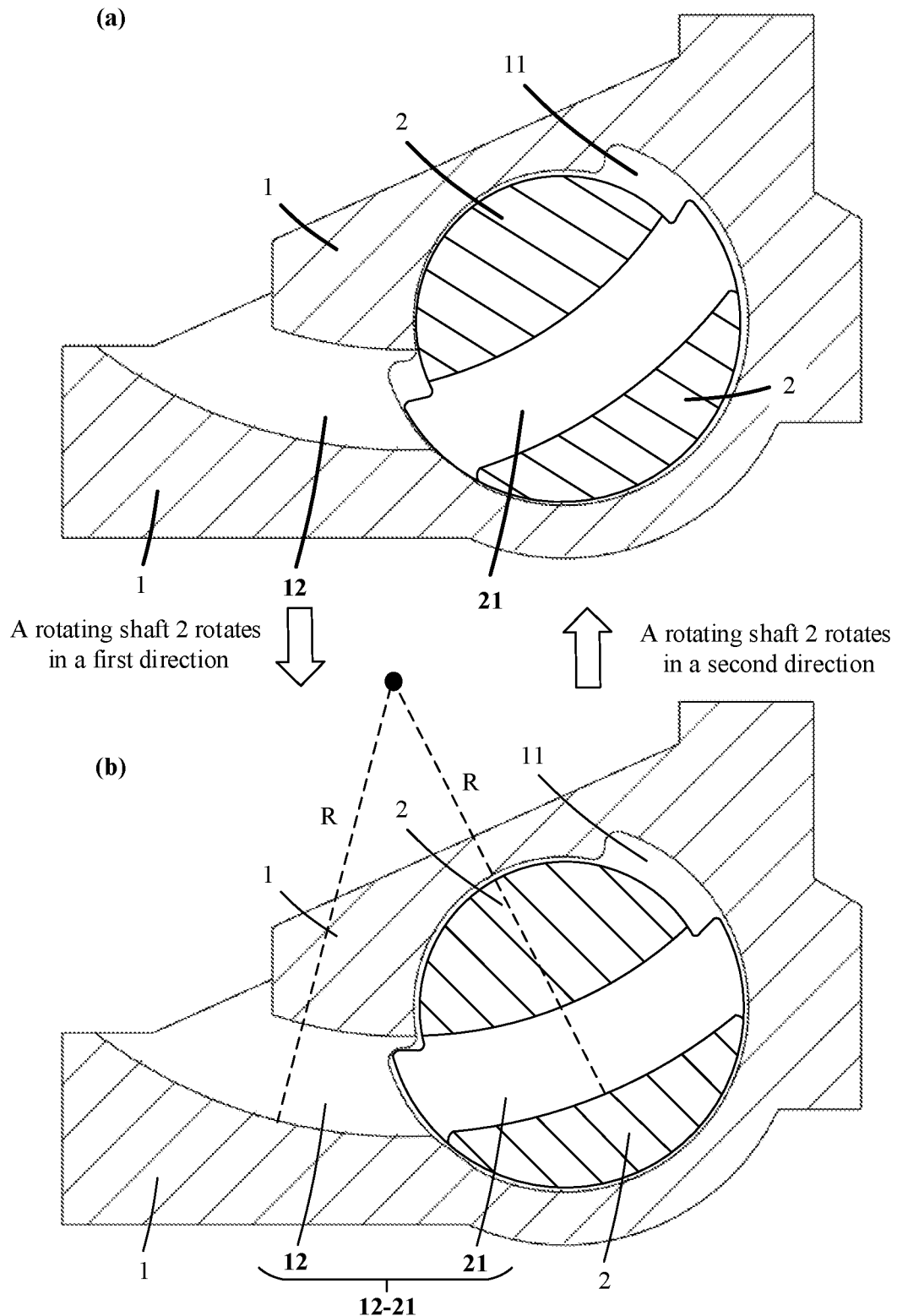
FIG. 13 is a schematic diagram of a scenario in which a rotating shaft is located in a rotating shaft through-hole and rotates in the rotating shaft through-hole according to an embodiment.

As shown in FIG. 13, a rotating shaft 2 is rotatably installed in a rotating shaft through-hole 11 of a base 1. Correspondingly, the rotating shaft 2 matches the rotating shaft through-hole 11 of the base 1. For example, an outer diameter of the rotating shaft 2 is slightly less than an inner diameter of the rotating shaft through-hole 11, and a length of the rotating shaft 2 is slightly less than that of the rotating shaft through-hole 11. As shown in FIG. 13, the rotating shaft 2 can be located in the rotating shaft through-hole 11, and the rotating shaft 2 can rotate in the rotating shaft through-hole 11. (a) in FIG. 13 is a schematic diagram of the rotating shaft 2 rotating to a position where a first slideway 12 and a second slideway 21 are staggered, and (b) in FIG. 13 is a schematic diagram of the rotating shaft 2 rotating to a position where the first slideway 12 and the second slideway 21 are connected to each other.

As shown in FIG. 13, a radius of the first slideway 12 of the base 1 is equal to that of the second slideway 21 of the rotating shaft 2, and its value may be denoted as R. In this way, as shown in FIG. 11, one end of the first slideway 12 communicates with the rotating shaft through-hole 11. As shown in FIG. 12, the second slideway 21 runs through the rotating shaft 2. As shown in FIG. 11, the radius of the first slideway 12 is equal to that of the second slideway 21. Therefore, as shown in FIG. 13, when the rotating shaft 2 rotates in the rotating shaft through-hole 11 in a first direction (for example, a clockwise direction) until an end portion of the first slideway 12 is connected to an end portion of the second slideway 21, the first slideway 12 and the second slideway 21 can form a continuous slideway, and the continuous slideway may be denoted as a continuous slideway 12-21.

As shown in (b) in FIG. 13, after the rotating shaft 2 rotates in the first direction (for example, the clockwise direction) until the first slideway 12 and the second slideway 21 are connected to form the continuous slide 12-21, the rotating shaft 2 no longer continues rotating in the first direction. Correspondingly, as shown in (a) in FIG. 14, an inner wall of the rotating shaft through-hole 11 is provided with a first limiting platform 111, an outer surface of the rotating shaft 2 is provided with a second limiting platform 22, the first limiting platform 111 and the second limiting platform 22 are located in a same circumferential direction, and when the rotating shaft 2 rotates in the rotating shaft through-hole 11 until the first limiting platform 111 comes into contact with the second limiting platform 22, as shown in (b) in FIG. 14 and referring to (b) in FIG. 13, the first slideway 12 and the second slideway 21 form a continuous slideway 12-21. 111' in (b) in FIG. 14 indicates a projection of the first limiting platform 111, and 22' indicates a projection of the second limiting platform 22.

Figure 14:
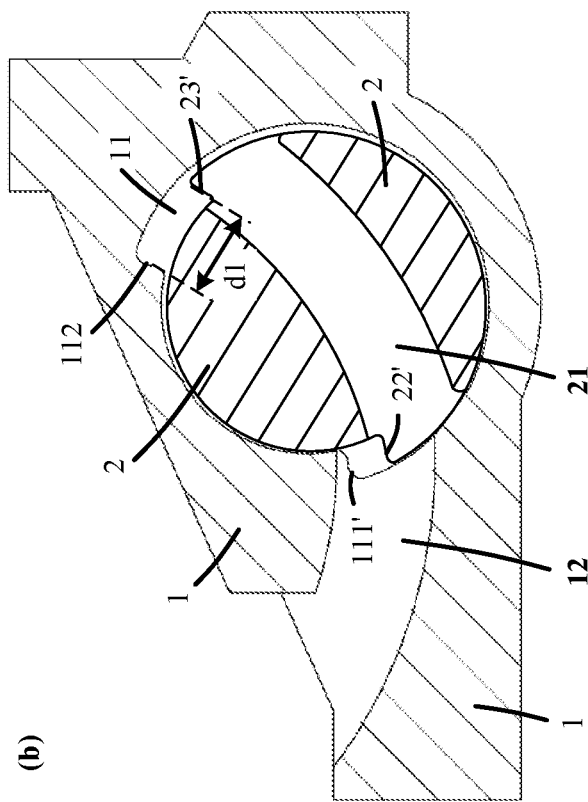
FIG. 14 is a cross-sectional view of a rotating shaft located in a rotating shaft through-hole according to an embodiment, where (a) is a schematic diagram of a cross-section taken at the rotating shaft through-hole but not at a first slideway and a second slideway, and (b) is a schematic diagram of a cross-section taken at the first slideway, the second slideway, and the rotating shaft through-hole.
Figure 14:
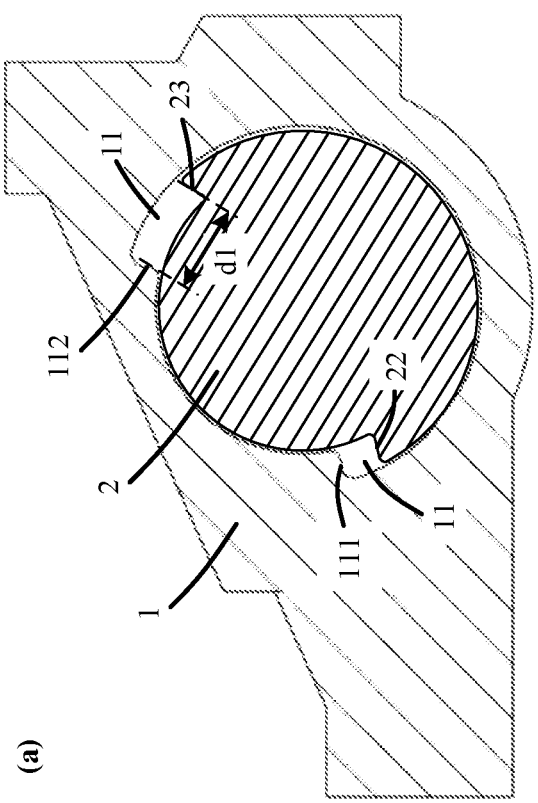

It should be noted that a cross-sectional view shown in (a) in FIG. 14 is a schematic diagram taken at positions of the first slideway 12 and the second slideway 21, and a cross-sectional view shown in (b) in FIG. 14 is a schematic diagram not taken at the positions of the first slideway 12 and the second slideway 21.

As shown in FIG. 14, the second limiting platform 22 and the first limiting platform 111 are located in a same circumferential direction, so that when the rotating shaft 2 rotates in the rotating shaft through-hole 11, the second limiting platform 22 can come into contact with the first limiting platform 111, and the first limiting platform 111 prevents the rotating shaft 2 from rotating in the original direction. For example, as shown in (b) in FIG. 14 and referring to (b) in FIG. 13, the rotating shaft 2 is prevented from rotating in the first direction (for example, the clockwise direction).

Figure 15:
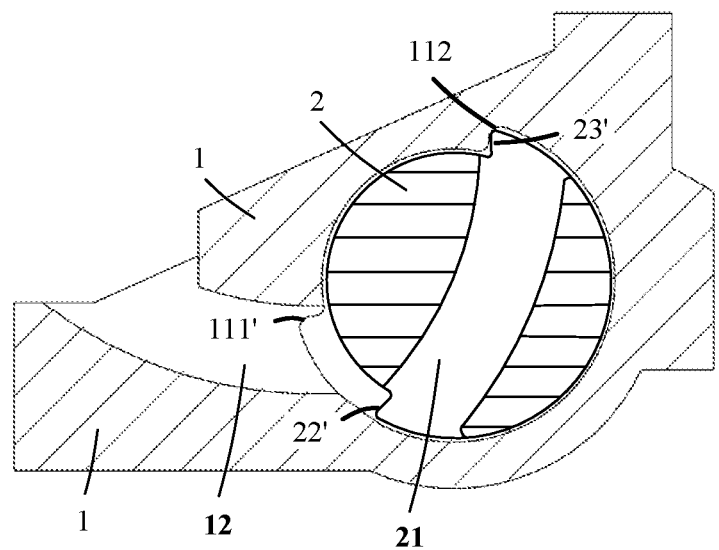
FIG. 15 is a schematic diagram showing that a rotating shaft is located in a rotating shaft through-hole and rotates until a third limiting platform comes into contact with a fourth limiting platform according to an embodiment.

To make the rotating shaft 2 rotate to a position in a second direction (for example, a counterclockwise direction) and then no longer continue rotating in the second direction, correspondingly, still referring to FIG. 14, the inner wall of the rotating shaft through-hole 11 is provided with a third limiting platform 112, the outer surface of the rotating shaft 2 is provided with a fourth limiting platform 23, and the fourth limiting platform 23 and the third limiting platform 112 are located in a same circumferential direction. As shown in FIG. 14 and referring to FIG. 15, when the rotating shaft 2 rotates in the rotating shaft through-hole 11 until the third limiting platform 112 comes into contact with the fourth limiting platform 23, the rotating shaft 2 stops rotating in the original rotation direction. For example, as shown in FIG. 15, the rotating shaft 2 is prevented from rotating in the second direction (for example, the counterclockwise direction). A reference numeral 23' in FIG. 15 indicates a projection of the fourth limiting platform 23.

As shown in FIG. 15, the fourth limiting platform 23 and the third limiting platform 112 are located in a same circumferential direction, so that when the rotating shaft 2 rotates in the rotating shaft through-hole 11, the fourth limiting platform 23 can come into contact with the third limiting platform 112, and the third limiting platform 112 prevents the rotating shaft 2 from rotating in the original direction. For example, as shown in FIG. 15, the rotating shaft 2 is prevented from rotating in the counterclockwise direction.

The contact between the third limiting platform 112 and the fourth limiting platform 23 shown in FIG. 15 can restrain the rotating shaft 2 from rotating in the second direction. An implementation manner of restraining the rotating shaft 2 from rotating in the second direction further includes other manners. For example, referring back to FIG. 7, a possible manner may be that when two swing arms 3 located on different sides of the base 1 collide, the rotating shaft 2 can also be restrained from rotating in the second direction. For another example, another possible manner may be that as shown in (c) in FIG. 18, as introduced below, a third limiting platform 112 comes into contact with a locking portion 33 of a swing arm 3 to restrain a rotating shaft 2 from rotating in a second direction. This solution will be described below when the swing arm 3 is described.

The foregoing limiting platforms, such as the first limiting platform 111, the second limiting platform 22, the third limiting platform 112, and the fourth limiting platform 23, are formed in a similar manner, and there are a plurality of formation manners.

For example, as shown in FIG. 14, the first limiting platform 111 and the third limiting platform 112 may be formed in such a manner that a cross-sectional figure of the rotating shaft through-hole 11 is of a closed structure formed by two arcs, and radii of the two arcs are different. Then two steps are formed at an intersection of the two arcs, one step may be used as the first limiting platform 111, and the other step may be used as the third limiting platform 112. Alternatively, the inner wall of the rotating shaft through-hole 11 is provided with a strip-shaped protrusion structure in the circumference direction. One end of the strip-shaped protrusion structure may be used as the first limiting platform 111, and the other end thereof may be used as the third limiting platform 112.

Similarly, as shown in FIG. 14, the second limiting platform 22 and the fourth limiting platform 23 may be formed in such a manner that a cross-sectional figure of the rotating shaft 2 is of a closed structure formed by two arcs, and radii of the two arcs are different. Then two steps are formed at an intersection of the two arcs, one step may be used as the second limiting platform 22, and the other step may be used as the fourth limiting platform 23.

Certainly, as for a specific forming manner, in addition to being formed in the foregoing manner, the first limiting platform 111, the second limiting platform 22, the third limiting platform 112, and the fourth limiting platform 23 may alternatively be formed in the following manner: The first limiting platform 111 and the third limiting platform 112 each may be of a protrusion structure located on the inner wall surface of the rotating shaft through-hole 11 and protruding toward an axis; and the second limiting platform 22 and the fourth limiting platform 23 each may be of a protrusion structure located on the outer surface of the rotating shaft 2 and protruding away from the axis.

In this embodiment, a specific manner of forming the first limiting platform 111, the second limiting platform 22, the third limiting platform 112, and the fourth limiting platform 23 is not limited, provided that the following is met: The first limiting platform 111 and the second limiting platform 22 are located in a same circumferential direction, so that the first limiting platform 111 and the second limiting platform 22 can be in contact with each other, and when the first limiting platform 111 and the second limiting platform 22 are in contact with each other, the first slideway 12 and the second slideway 21 are connected to form a continuous slideway 12-21; and the third limiting platform 112 and the fourth limiting platform 23 are located in a same circumferential direction, so that the third limiting platform 112 and the fourth limiting platform 23 can be in contact with each other.

Figure 16:
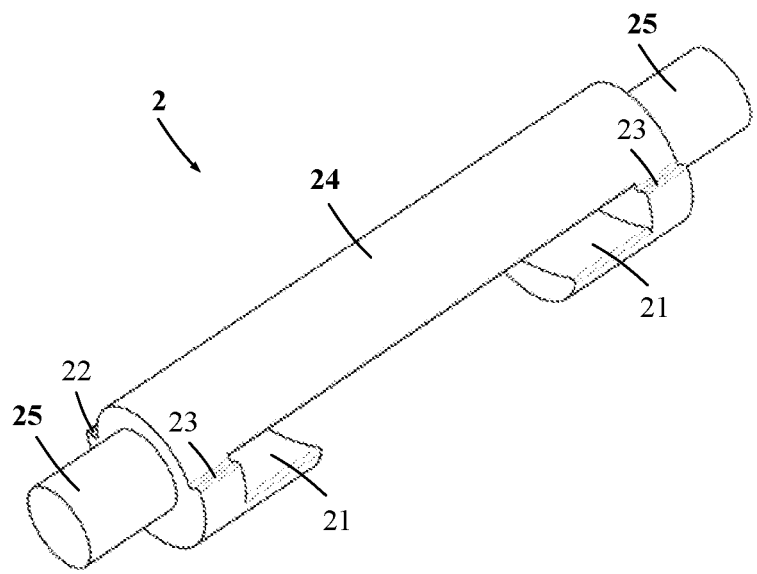
FIG. 16 is a schematic diagram of a structure of a rotating shaft according to an embodiment.

As shown in FIG. 14, an outer wall of the rotating shaft 2 is provided with a second limiting platform 22 and a fourth limiting platform 23. Correspondingly, as shown in FIG. 16, a rotating shaft 2 may include an assembly column 24 and two support columns 25. The assembly column 24 is located between the two support columns 25, and an axis of the assembly column 24 and axes of the two support columns 25 are collinear. The second slideway 21, the second limiting platform 22, and the fourth limiting platform 23 are all arranged on the assembly column 24.

Figure 17:
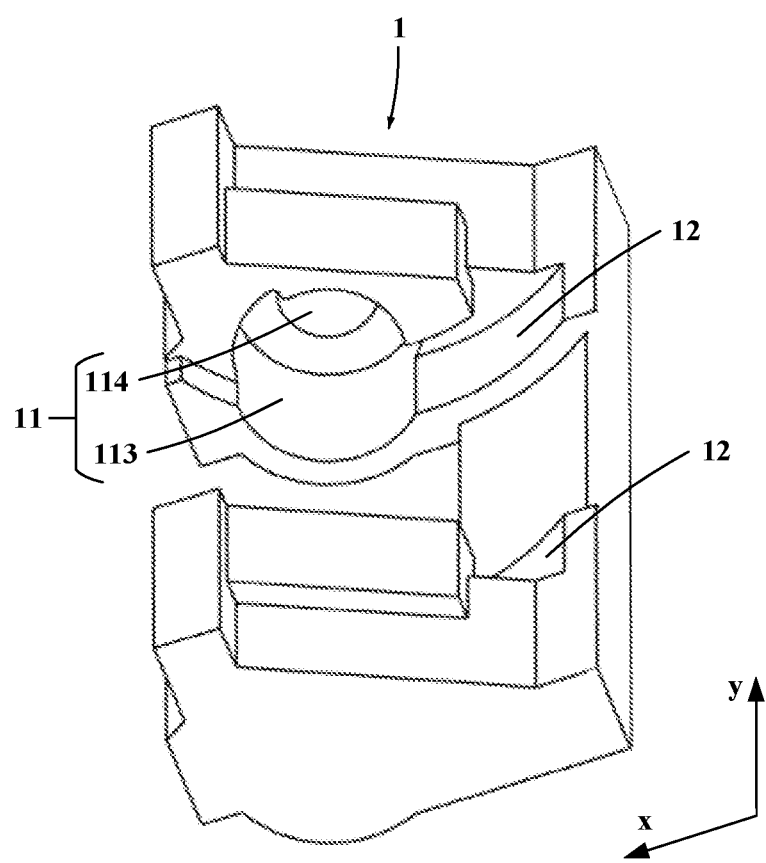
FIG. 17 is a schematic diagram of a structure of a base according to an embodiment.

To match the structure of the rotating shaft 2, correspondingly, as shown in FIG. 17, the rotating shaft through-hole 11 includes a first-section through-hole 113 and two second-section through-holes 114. The first-section through-hole 113 is located between the two second-section through-holes 114, and an axis of the first-section through-hole 113 and axes of the second-section through-holes 114 are collinear. The first-section through-hole 113 matches the assembly column 24, and the second-section through-holes 114 match the support columns 25. The first limiting platform 111 and the third limiting platform 112 are arranged on an inner wall of the first-section through-hole 113.

In this way, after the rotating shaft 2 is installed in the rotating shaft through-hole 11 of the base 1, the assembly column 24 is located in the first-section through-hole 113, and the support columns 25 are located in the second-section through-holes 114.

In this way, the support columns 25 with circular cross-sections are located in the second-section through-holes 114 with circular cross-sections, so that the rotating shaft 2 can smoothly rotate in the rotating shaft through-hole 11.

As described above, the rotating assembly further includes a swing arm 3. Referring to FIG. 4 and FIG. 5, a part of the swing arm 3 is installed in the base 1, and the other part is located outside the base 1 and is used to connect a body. Correspondingly, as shown in FIG. 10, the swing arm 3 includes a body connecting portion 31, a sliding portion 32, and a locking portion 33. As shown in FIG. 10, the body connecting portion 31, the sliding portion 32, and the locking portion 33 are sequentially connected, and the locking portion 33 is located on a side portion of the sliding portion 32 and far away from an end portion of the body connecting portion 31.

The body connecting portion 31 is configured to connect a body, and the sliding portion 32 and the locking portion 33 are configured to connect the base 1. For example, the sliding portion 32 and the locking portion 33 are configured to be inserted into the continuous slideway 12-21 of the base 1 and slide back and forth in the continuous slideway 12-21.

It should be noted that the body connecting portion 31 shown in FIG. 10 is a partial structure, and for an overall structure of the body connecting portion 31, reference may be made to FIG. 4.

To enable the sliding portion 32 and the locking portion 33 to slide back and forth in the continuous slideway 12-21, correspondingly, as shown in FIG. 10, the sliding portion 32 and the locking portion 33 are each of an arc-shaped structure and match the continuous slideway 12-21. For example, a radius of a circle where the sliding portion 32 is located is equal to a radius of a circle where the locking portion 33 is located, and slightly less than a radius of a circle where the continuous slideway 12-21 is located. In this way, as shown in FIG. 18, the sliding portion 32 and the locking portion 33 can be located in the continuous slideway 12-21, and can slide in the continuous slideway 12-21.

Figure 18:
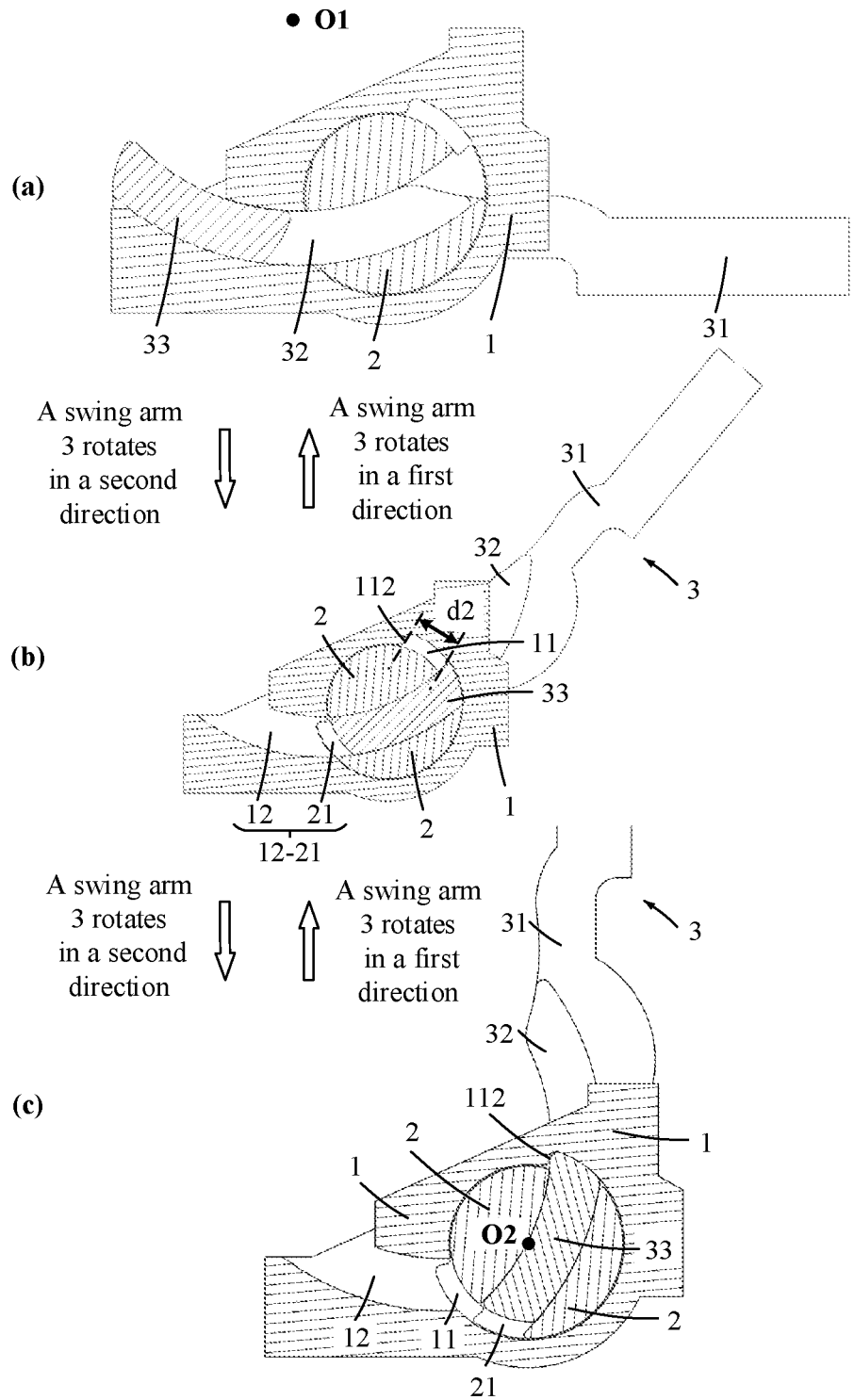
FIG. 18 is a schematic diagram of a scenario in which a swing arm of a rotating assembly rotates according to an embodiment.

As shown in FIG. 18, an arc length of the locking portion 33 is less than or slightly less than an arc length of the second slideway 21. In this way, as shown in (b) in FIG. 18, when the locking portion 33 is completely located in the second slideway 21 and the swing arm 3 rotates in the second direction relative to the base 1, as shown in (b) and (c) in FIG. 18, the locking portion 33 can drive the rotating shaft 2 to rotate in the rotating shaft through-hole 11.

Based on the foregoing description, as shown in FIG. 18, during rotation of the swing arm 3 in the second direction (for example, the counterclockwise direction), the rotation process of the swing arm 3 is as follows.

A state shown in (a) in FIG. 18 is an initial state in which the swing arm 3 rotates in the second direction, and a state shown in (c) in FIG. 18 is a final state in which the swing arm 3 rotates in the second direction.

As shown in (a) in FIG. 18, an end portion that is of the locking portion 33 and that is far away from the body connecting portion 31 is in contact with an end portion that is of the continuous slideway 12-21 and that is far away from the rotating shaft through-hole 11. When the swing arm 3 rotates in the second direction, the sliding portion 32 and the locking portion 33 of the swing arm 3 slide in the continuous slideway 12-21. As shown in (b) in FIG. 18, when the end portion that is of the locking portion 33 of the swing arm 3 and that is close to the body connecting portion 31 is in contact with the end portion that is of the rotating shaft through-hole 11 and that is at the rotating shaft through-hole 11, the locking portion 33 is completely located in the second slideway 21. In this case, as shown in (b) in FIG. 18, the swing arm 3 has already slid in the continuous slideway 12-21 to the end portion position of the continuous slideway 12-21, and cannot continue to slide in the continuous slideway 12-21 in the second direction.

When the swing arm 3 continues rotating in the second direction, the locking portion 13 drives the rotating shaft 2 to rotate in the rotating shaft through-hole 11. As shown in (c) in FIG. 18, when rotating until the third limiting platform 112 comes into contact with the locking portion 33, the rotating shaft 2 stops rotating in the second direction, and the swing arm 3 also stops rotating in the second direction.

As described above, the contact between the third limiting platform 112 and the locking portion 33 restrains the rotating shaft 2 from rotating in the rotating shaft through-hole 11 in the counterclockwise direction.

As described above, restraining the rotating shaft 2 from rotating in the rotating shaft through-hole 11 in the counterclockwise direction may also be implemented by the contact between the third limiting platform 112 and the fourth limiting platform 23, as shown in FIG. 14 and FIG. 15.

It can be learned that when the swing arm 3 rotates in the second direction to a state shown in (c) in FIG. 18, the third limiting platform 112 can be configured to restrain the swing arm 3 from rotating in the second direction. For example, as shown in FIG. 14 and FIG. 15, the third limiting platform 112 may restrain the swing arm 3 from rotating in the second direction by cooperating with the fourth limiting platform 23. For another example, as shown in (c) in FIG. 18, the third limiting platform 112 can also restrain the swing arm 3 from rotating in the second direction by cooperating with the locking portion 33 of the swing arm 3.

When the third limiting platform 112 cooperates with the fourth limiting platform 23 to implement limiting, an arc length distance d1 between the third limiting platform 112 and the fourth limiting platform 23 (see (a) in FIG. 14) needs to be greater than or equal to an arc length distance d2 between the third limiting platform 112 and the locking portion 33 of the swing arm 3 (see (b) in FIG. 18). In this way, during rotation of the swing arm 3 in the second direction, the third limiting platform 112 first comes into contact with the fourth limiting platform 23, to restrain the rotating shaft 2 from rotating in the original direction.

Similarly, when the third limiting platform 112 cooperates with the locking portion 33 to implement limiting, the arc length distance d2 between the third limiting platform 112 and the locking portion 33 of the swing arm 3 (see (b) in FIG. 18) needs to be greater than or equal to the arc length distance d1 between the third limiting platform 112 and the fourth limiting platform 23 (see (a) in FIG. 18). In this way, during rotation of the swing arm 3 in the second direction, the third limiting platform 112 first comes into contact with the locking portion 33, to restrain the rotating shaft 2 from rotating in the original direction.

The above describes the effect of restraining the rotating shaft 2 from rotating in the original direction by using the third limiting platform 112. In some examples, limiting may also be implemented without the third limiting platform 112. For example, as shown in FIG. 7, when the swing arm 3 on the left side of the base 1 and the swing arm 3 on the right side of the base 1 rotate to come into contact with each other, the rotating shaft 2 can also be restrained from rotating in the rotating shaft through-hole 11 in the second direction.

The above describes the process of rotation of the swing arm 3 in the second direction. The swing arm 3 may also rotate in the first direction opposite to the second direction, to make the swing arm 3 rotate back and forth. Reverse movement, that is, the process of rotation of the swing arm 3 in the first direction, will be described below.

A state shown in (c) in FIG. 18 is an initial state in which the swing arm 3 rotates in the first direction, and a state shown in (a) in FIG. 18 is a final state in which the swing arm 3 rotates in the first direction.

As shown in (c) and (b) in FIG. 18, when the swing arm 3 drives the rotating shaft 2 to rotate in the first direction until the first limiting platform 111 and the second limiting platform 22 come into contact with each other (see FIG. 13), the rotating shaft 2 stops rotating in the first direction, and in this case, the first slideway 12 and the second slideway 21 are connected to form a continuous slideway 12-21.

As shown in (b) in FIG. 18, when the swing arm 3 continues rotating in the first direction, the sliding portion 32 and the locking portion 33 of the swing arm 3 slide in the continuous slideway 12-21. As shown in (a) in FIG. 18, when the locking portion 33 slides in the continuous slideway 12-21 to an end portion of the continuous slideway 12-21, that is, when the end portion that is of the locking portion 33 and that is far away from the body connecting portion 31 comes into contact with the end portion that is of the first slideway 12 and that is far away from the second slideway 21, the swing arm 3 has already slid in the continuous slideway 12-21 to the end portion position of the continuous slideway 12-21 and cannot continue sliding in the continuous slideway 12-21.

It can be learned from the rotation process of the swing arm 3 in FIG. 18 that during rotation of the swing arm 3 relative to the base 1, two stages are included. As shown in (a) and (b) in FIG. 18, in one stage, the sliding portion 32 and the locking portion 33 of the swing arm 3 slide in the continuous slideway 12-21; and as shown in (b) and (c) in FIG. 18, in the other stage, the locking portion 33 of the swing arm 3 drives the rotating shaft 2 to rotate in the rotating shaft through-hole 11.

During sliding of the swing arm 3 slides in the continuous slideway 12-21, a rotation angle range of rotation of the swing arm 3 relative to the base 1 may be denoted as a first angle range; and when the swing arm 3 drives the rotating shaft 2 to rotate, a rotation angle range of rotation of the swing arm 3 relative to the base 1 may be denoted as a second angle range.

The first angle range and the second angle range are two consecutive angle ranges. For example, a maximum angle of the first angle range is equal to a minimum angle of the second angle range. For example, the first angle range may be approximately 0° to 45°, and the second angle range may be approximately 45° to 90°. For example, as shown in (a) in FIG. 18, an included angle between the swing arm 3 and the base 1 is approximately 0°; as shown in (b) in FIG. 18, an included angle between the swing arm 3 and the base 1 is approximately 45°; and as shown in (c) in FIG. 18, an included angle between the swing arm 3 and the base 1 is approximately 90°.

Certainly, the first angle range and the second angle range may alternatively be flexibly divided based on an actual situation. An example in which the swing arm 3 rotates in an angle range between 0° and 90° may be provided in the description.

Then, based on the foregoing description, limiting in cases where the swing arm 3 rotates to the minimum angle of the first angle range, the minimum angle of the first angle range, the minimum angle of the second angle range, and the maximum angle of the second angle range may be implemented in the following manner.

As shown in (a) and (b) in FIG. 18, during rotation of the swing arm 3 from the maximum angle of the first angle range to the minimum angle of the first angle range, when the rotation angle of the swing arm 3 reaches the minimum angle of the first angle range through the contact between the end portion that is of the locking portion 33 and that is far away from the body connecting portion 31 and the end portion that is of the first slideway 12 and that is far away from the second slideway 21, the swing arm 3 no longer continues sliding in the original direction.

As shown in (a) and (b) in FIG. 18, during rotation of the swing arm 3 from the minimum angle of the first angle range to the maximum angle of the first angle range, when the rotation angle of the swing arm 3 reaches the maximum angle of the first angle range through the contact between the end portion that is of the locking portion 33 that is close to the body connecting portion 31 and the end portion that is of the second slideway 21 and that is far away from the first slideway 12, the swing arm 3 no longer continues sliding in the original direction, so that the swing arm 3 rotates in the second angle range, and the swing arm 3 drives the rotating shaft 2 to rotate.

As shown in (b) and (c) in FIG. 18, during rotation of the swing arm 3 from the maximum angle of the second angle range to the minimum angle of the second angle range, when the rotation angle of the swing arm 3 reaches the minimum angle of the second angle range through the contact between the first limiting platform 111 and the second limiting platform 22, the swing arm 3 no longer drives the rotating shaft 2 to rotate in the original direction, and the first slideway 12 and the second slideway 21 are just connected to form a continuous slideway 12-21, so that the swing arm 3 rotates in the first angle range, and the swing arm 3 slides in the continuous slideway 12-21.

As shown in (b) and (c) in FIG. 18, during rotation of the swing arm 3 from the minimum angle of the second angle range to the maximum angle of the second angle range, in one manner, as shown in (c) in FIG. 18, through the contact between the third limiting platform 112 and the locking portion 33, the swing arm 3 may no longer continue driving the rotating shaft 2 to rotate in the original direction; in another manner, as shown in FIG. 15, through the contact between the third limiting platform 112 and the fourth limiting platform 23, the swing arm 3 may no longer continue driving the rotating shaft 2 to rotate in the original direction; and in another manner, as shown in FIG. 7, through the collision between two swing arms 3 located on different sides of the base 1, the swing arms 3 may no longer continue driving the rotating shaft 2 to rotate in the original direction.

Still referring to (a) and (b) in FIG. 18, during sliding of the swing arm 3 in the continuous slideway 12-21, that is, during rotation of the swing arm 3 in the first angle range relative to the base 1, the swing arm 3 moves circularly relative to the base 1, and an axis of this circular movement is a center of a circle where the continuous slideway 12-21 is located. The center of the circle is also a center of a circle where the first slideway 12 is located, and this axis may be referred to as a first axis O1. During the circular movement of the swing arm 3 around the first axis O1, the rotation radius of the swing arm 3 is denoted as R.

As shown in (b) and (c) in FIG. 18, when the swing arm 3 drives the rotating shaft 2 to rotate in the rotating shaft through-hole 11, that is, during rotation of the swing arm 3 in the second angle range relative to the base 1, the swing arm 3 also moves circularly relative to the base 1, an axis of this circular movement is a rotation center of the rotating shaft 2, and the axis may be referred to as a second axis O2. During the circular movement of the swing arm 3 around the first axis OA1, the rotation radius of the swing arm 3 is denoted as r.

The rotation radius R of the swing arm 3 in the first angle range is greater than the rotation radius r of the swing arm 3 in the second angle range.

Figure 19:
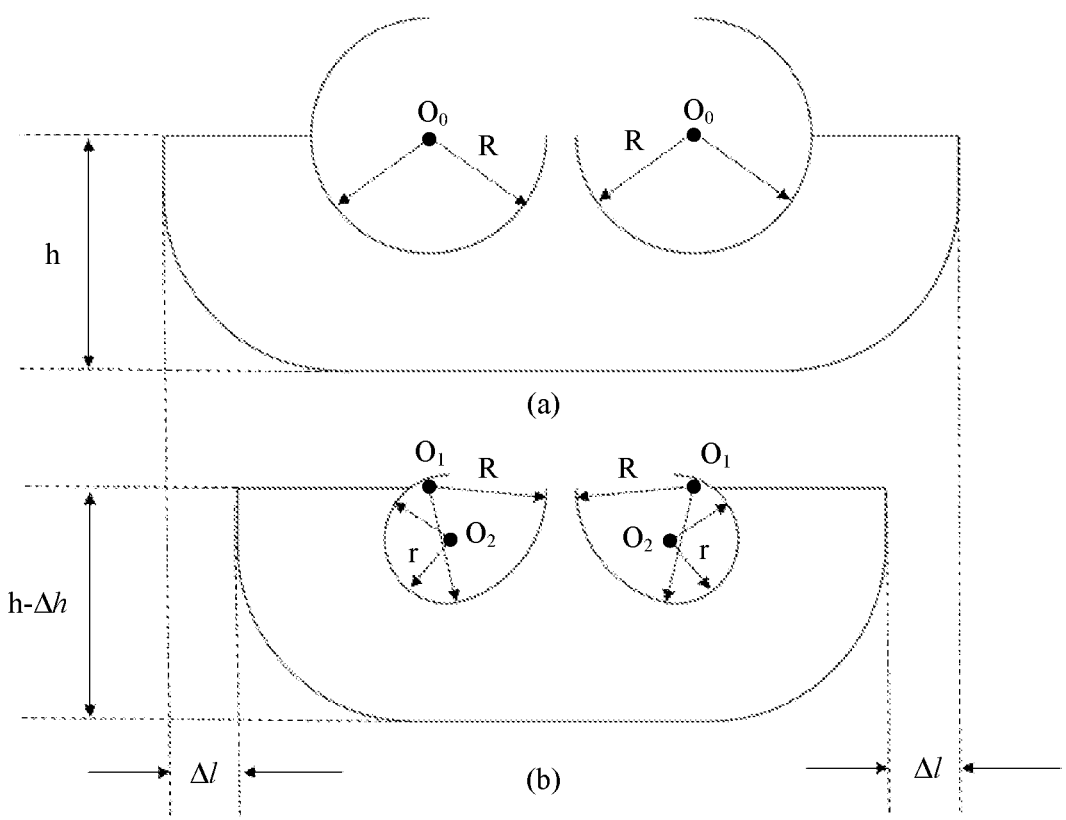
FIG. 19 is a schematic diagram of a rotation track of a swing arm of a rotating assembly according to an embodiment.

(a) in FIG. 19 is a schematic diagram of a track of a swing arm 3 when in existing technologies, during rotation of the swing arm 3 from a minimum angle of a first angle range to a maximum angle of a second angle range relative to a base 1, the swing arm 3 always rotates around an axis O0 based on a rotation radius R. A length of the track may be denoted as S2.

(b) in FIG. 19 is a schematic diagram of a track of the swing arm 3 when in this application, during rotation of the swing arm 3 from the minimum angle of the first angle range to the maximum angle of the second angle range relative to the base 1, the swing arm 3 first rotates around a first axis O1 based on the rotation radius R and then rotates around a second axis O2 based on a rotation radius r. A length of the track may be denoted as S1.

As shown in (a) and (b) in FIG. 19, during rotation of the swing arm 3 of this application and the swing arm 3 of existing technologies at a same angle relative to the base 1, the track length S1 of the entire process when the swing arm 3 of this application first rotates around the first axis O1 with the radius R and then rotates around the second axis O2 with the radius r is less than the track length S2 of the entire process when the swing arm 3 of existing technologies always rotates around the axis O0 with the radius R.

However, when the length of the movement track of the swing arm 3 in the rotating assembly is small, the size of the rotating assembly also becomes small. For example, the length of the rotating assembly is reduced by Δl and a thickness is reduced by Δh. Then, when the rotating assembly is applied to a foldable terminal, an occupied space in the foldable terminal can be reduced.

In FIG. 19, h represents a thickness of the rotating assembly, Δh represents a difference between a thickness of a rotating assembly of existing technologies as an example in (a) and a thickness of a rotating assembly of this solution as an example in (b), and Δl represents a difference between a length of a rotating assembly of existing technologies as an example in (a) and a length of the rotating assembly of this solution as an example in (b).

It should be noted that, because during folding of the foldable terminal, a screen is subjected to a relatively large acting force in an initial folding stage and is easily damaged, a relatively large rotation radius is needed, and the screen is subjected to a reduced acting force in a subsequent stage, so that the rotation radius may be reduced.

It can be learned that when the rotating assembly is applied to a foldable terminal, the swing arm 3 of the rotating assembly can switch a rotation axis and the rotation radius during the entire rotation, and the rotation radius in the first angle range is greater than that in the second angle range. A large rotation radius in the first angle range makes the swing arm 3 rotate relatively gently, which can reduce a pulling force on the screen from flattening to folding, thereby protecting the screen. A small rotation radius in the second angle range can reduce a size of the rotating assembly.

In addition, the reduction of the size of the rotating assembly can reduce the space in the foldable mechanism that is occupied by the rotating assembly, can reduce the size of the foldable mechanism, and reduce the space in the foldable terminal that is occupied by the foldable mechanism, thereby reducing the size of the foldable terminal, so that the size of the foldable terminal can be minimized on the basis of meeting folding requirements.

It should be noted that the rotation radius R of the swing arm 3 in the first angle range and the rotation radius r thereof in the second angle range are both related to a bending radius of the screen of the foldable terminal to which the rotating assembly is applied. A technician may select the rotation radius R of the swing arm 3 in the first angle range and the rotation radius r thereof in the second angle range based on an actual bending radius of the screen of the foldable terminal.

For specific shapes of the base 1, the rotating shaft 2, and the swing arm 3, in actual application of the rotating assembly, the technical may flexibly design specific shapes of the base 1, the rotating shaft 2, and the swing arm 3 based on machining requirements and assembly requirements.

For example, as shown in FIG. 6, the base 1 has a notch in an axial direction of the rotating shaft through-hole 11, that is, the base 1 has a notch in a y-axis direction, and the overall base 1 is I-shaped. For another example, as shown in FIG. 10, the base 1 may also be I-shaped for a rotating assembly including one swing arm 3. In this way, each rotating shaft through-hole 11 is divided into two parts in the y-axis direction, so that the rotating shaft 2 is easily assembled in the rotating shaft through-hole 11 during assembly. In assembly, the base 1 may be split in the Y-axis direction, and after the rotating shaft 2 and the swing arm 3 are assembled, the two parts split in the y-axis direction are fixedly connected to each other.

In this embodiment, a specific shape of the base 1 is not limited, provided that the base 1 has the following structure: a rotating shaft through-hole 11 and a first slideway 12, an inner wall of the rotating shaft through-hole 11 is provided with a first limiting platform 111 and a third limiting platform 112, the rotating shaft through-hole 11 communicates with an end of the first slideway 12, and an axis of the rotating shaft through-hole 11 is parallel to an axis of the first slideway 12.

For another example, for a specific shape of the rotating shaft 2, as shown in FIG. 10, the rotating shaft 2 includes an assembly column 24 and two support columns 25 in an axial direction, that is, in the y-axis direction, and a second slideway 21, a second limiting platform 22, and a fourth limiting platform 23 are all arranged on the assembly column 24.

In this embodiment, a specific shape of the rotating shaft 2 is not limited, provided that the rotating shaft 2 has the following structure: the second slideway 21 running through the inside of the rotating shaft 2, and the second limiting platform 22 and the fourth limiting platform 23 located on the outer surface of the rotating shaft 2, the second slideway 21 corresponds to the first slideway 12, the second limiting platform 22 matches the first limiting platform 111, and the fourth limiting platform 23 matches the third limiting platform 112.

As shown in FIG. 6, the rotating shaft 2 has a notch in an axial direction, so that a protrusion structure of the swing arm 3 can fill the notch position of the base 1 in the axial direction.

For another example, a specific shape of the swing arm 3 is not limited in this embodiment, provided that the swing arm 3 has the following structure: a sliding portion 32 and a locking portion 33 that match a continuous slideway 12-21. The locking portion 33 is located on an end portion of the sliding portion 32 and on one or two sides in the y-axis direction, so that the swing arm 3 can slide in the continuous slideway 12-21, and the locking portion 33 can limit the sliding in the continuous slideway 12-21.

As shown in FIG. 6, a surface of the sliding portion 32 of the swing arm 3 has a protrusion structure, so that the protrusion structure on the surface of the swing arm 3 can fill the notch position of the base 1 after the swing arm 3 passes through the rotating shaft 2 and is installed in the base 1. If the base 1 has no notch in the y-axis direction, the rotating shaft 2 may have no notch in the y-axis direction, and the surface of the swing arm 3 may have no protrusion structure.

In this embodiment of this application, when rotating in a first angle range, a swing arm of the rotating assembly slides in a continuous slideway, and moves, relative to a base, circularly around a center of a circle where a first slideway is located; and when rotating in a second angle range, the swing arm drives a rotating shaft to rotate, and moves circularly around an axis of the rotating shaft relative to the base, and a rotation radius of the swing arm in the first angle range is greater than that in the second angle range. It can be learned that the swing arm of the rotating assembly can switch a rotation axis and the rotation radius during the entire rotation, and the rotation radius of the swing arm in the first angle range is large, so that the swing arm rotates relatively gently in the first angle range, which can reduce a pulling force on the screen from flattening to bending, thereby protecting the screen. The swing arm has a small rotation radius in the second angle range, which can reduce a length of the rotating assembly, and then reduce a space in the foldable mechanism that is occupied by the rotating assembly, and reduce a size of the foldable mechanism, thereby reducing a space in the foldable terminal that is occupied by the foldable mechanism.

An embodiment of this application further provides a foldable mechanism. FIG. 4 and FIG. 5 are schematic diagrams of the foldable mechanism. The foldable mechanism not only includes the foregoing rotating assembly 101 and a door plate 102, but also includes a fastener 103, a limiting pin 104, a connecting plate 105, and a connecting shaft 106. A connection relationship between these components may be as follows.

As shown in FIG. 4 and referring to FIG. 5, during assembly of the foldable mechanism, the fastener 103 may be fixedly connected to an end portion of the base 1 of the rotating assembly 101. Then the rotating assembly 101 may be assembled. After the rotating assembly 101 is assembled, the door plate 102 may be installed on a side of the fastener 103 by using the limiting pin 104, the connecting plate 105, and the connecting shaft 106. For example, the limiting pin 104 is installed on a surface of the door plate 102, and a distance is reserved between the limiting pin 104 and the door plate 102. One side of the connecting plate 105 is rotatably installed on a side of the fastener 103 by using the connecting shaft 106, and the other side of the connecting plate 105 is inserted between the limiting pin 104 and the door plate 102. The connecting plate 105 can slide between the limiting pin 104 and the door plate 102 in a sliding direction perpendicular to a direction of the connecting shaft 106.

The limiting pin 104 may be replaced by a limiting plate, the limiting plate is installed on the surface of the door plate 102, and a side of the connecting plate 105 far from the base 1 is inserted between the limiting plate and the door plate 102, and can slide left and right between the limiting plate and the door plate 102.

In this way, when the swing arm 3 is switched from driving the rotating shaft 2 to rotate to sliding in the continuous slideway 12-21, the rotation radius of the swing arm 3 becomes larger, and the connecting plate 105 slides in a direction away from the door plate 102 to increase the rotation radius of the door plate 102, so as to adapt to the increase of the rotation radius of the swing arm 3. When the swing arm 3 is switched from sliding in the continuous slideway 12-21 to driving the rotating shaft 2 to rotate, the rotation radius of the swing arm 3 becomes smaller, and the connecting plate 105 slides in a direction close to the door plate 102 to reduce the rotation radius of the door plate 102, so as to adapt to the reduction of the rotation radius of the swing arm 3.

It can be learned that during rotation of the swing arm 3, the door plate 102 rotates around the connecting shaft 106 under the driving of the connecting plate 105, to rotate with the swing arm 3. When the swing arm 3 switches the rotation radius, the connecting plate 105 slides leftward or rightward relative to the door plate 102 to adjust the rotation radius of the door plate 102 to adapt to a change in the rotation radius of the swing arm 3, so that the door plate 102 does not interfere with the movement of the swing arm 3 during the rotation of the swing arm 3.

In actual application of the foldable mechanism, to enable the swing arm 3 to be stabilized at a position after rotating to the position, correspondingly, the foldable mechanism may further include a damping mechanism, the damping mechanism blocks the rotation of the swing arm 3. A user needs to overcome an acting force exerted by the damping mechanism on the swing arm 3 before operating the swing arm 3 for rotating.

The damping mechanism may be a pneumatic damping mechanism, a hydraulic damping mechanism, a spring damping mechanism, or the like. A specific implementation manner of the damping mechanism is not limited in this embodiment.

In actual application of the foldable mechanism, if the foldable mechanism includes two or more swing arms 3, the foldable mechanism may further include a synchronization mechanism, so that a plurality of swing arms 3 can rotate synchronously.

In this embodiment of this application, when rotating in a first angle range, a swing arm of the rotating assembly slides in a continuous slideway, and moves, relative to a base, circularly around a center of a circle where a first slideway is located; and when rotating in a second angle range, the swing arm drives a rotating shaft to rotate, and moves circularly around an axis of the rotating shaft relative to the base, and a rotation radius of the swing arm in the first angle range is greater than that in the second angle range. It can be learned that when the rotating assembly is applied to a foldable terminal, the swing arm of the rotating assembly can switch a rotation axis and the rotation radius during the entire rotation, and the rotation radius of the swing arm in the first angle range is large, so that the swing arm rotates relatively gently in the first angle range, which can reduce a pulling force on the screen from flattening to bending, thereby protecting the screen. The swing arm has a small rotation radius in the second angle range, which can reduce a length of the rotating assembly, and then reduce a space in the foldable mechanism that is occupied by the rotating assembly, thereby facilitating miniaturization of the foldable mechanism. Once the size of the foldable mechanism is reduced, a space in the foldable terminal that is occupied by the foldable mechanism can be reduced.

An embodiment of this application further provides a foldable terminal. As shown in FIG. 1 to FIG. 3, the foldable terminal includes a first body 20, a second body 30, a screen 40, and the foregoing foldable mechanism 10. The foldable mechanism 10 is connected between the first body 20 and the second body 30. The screen 40 is located on surfaces of the first body 20, the second body 30, and the foldable mechanism 10, and is fastened to both the first body 20 and the second body 30.

The foldable mechanism of the foldable terminal includes the foregoing rotating assembly. When rotating in a first angle range, a swing arm of the rotating assembly slides in a continuous slideway, and moves, relative to a base, circularly around a center of a circle where a first slideway is located; and when rotating in a second angle range, the swing arm drives a rotating shaft to rotate, and moves circularly around an axis of the rotating shaft relative to the base, and a rotation radius of the swing arm in the first angle range is greater than that in the second angle range. It can be learned that the swing arm of the rotating assembly can switch a rotation axis and the rotation radius during the entire rotation, and the rotation radius of the swing arm in the first angle range is large, so that the swing arm rotates relatively gently in the first angle range, which can reduce a pulling force on the screen from flattening to bending, thereby protecting the screen. The swing arm has a small rotation radius in the second angle range, which can reduce a length of the rotating assembly, and then reduce a space in the foldable mechanism that is occupied by the rotating assembly, and reduce a size of the foldable mechanism, thereby reducing a space in the foldable terminal that is occupied by the foldable mechanism. Once the space in the foldable terminal that is occupied by the foldable mechanism is reduced, the size of the foldable terminal can be further reduced, so that the size of the foldable terminal can be minimized on the basis of meeting folding requirements.

It should be understood that this application is not limited to the precise structures that are described above and that are shown in the accompanying drawings, and various modifications and changes may be made without departing from the scope of this application. The scope of this application is limited only by the appended claims.

What is claimed is:

1. A rotating assembly, wherein the rotating assembly comprises a base, a rotating shaft, and a swing arm, wherein
the base is provided with a rotating shaft through-hole and an arc-shaped first slideway, an end of the first slideway communicates with the rotating shaft through-hole, an axis of the first slideway is parallel to an axis of the rotating shaft through-hole, the rotating shaft is provided with an arc-shaped second slideway, an axis of the rotating shaft is parallel to an axis of the second slideway, the second slideway runs through the rotating shaft, and a radius of the second slideway is equal to that of the first slideway;
the rotating shaft is located in the rotating shaft through-hole, and the first slideway and the second slideway can be connected to each other to form a continuous slideway, and the swing arm is located in the continuous slideway and is slidable in the continuous slideway; and
the swing arm is configured to slide in the continuous slideway when the swing arm rotates in a first angle range, and drive the rotating shaft to rotate when the swing arm rotates in a second angle range, wherein a rotation radius of the swing arm in the first angle range is greater than that in the second angle range.

2. The rotating assembly according to claim 1, wherein the swing arm comprises a body connecting portion, a sliding portion, and a locking portion that are sequentially connected, and the locking portion is located on a side portion of the sliding portion and far away from an end portion of the body connecting portion; and
the sliding portion and the locking portion each have an arc-shaped structure, the sliding portion fits with the continuous slideway, and the locking portion fits with the second slideway.

3. The rotating assembly according to claim 2, wherein when a rotation angle of the swing arm is a minimum angle of the first angle range, an end portion that is of the locking portion and that is far away from the body connecting portion is in contact with an end portion that is of the first slideway that is far away from the second slideway; or
when the rotation angle of the swing arm is a maximum angle of the first angle range, the locking portion is located in the second slideway, and an end portion that is of the locking portion that is close to the body connecting portion is in contact with an end portion that is of the second slideway that is far away from the first slideway.

4. The rotating assembly according to claim 2, wherein an arc length of the locking portion is less than that of the second slideway.

5. The rotating assembly according to claim 1, wherein an inner wall of the rotating shaft through-hole is provided with a first limiting platform, an outer surface of the rotating shaft is provided with a second limiting platform, and the second limiting platform and the first limiting platform are located in a same circumferential direction; and
when the rotation angle of the swing arm is a minimum angle of the second angle range, the first limiting platform is in contact with the second limiting platform, and the first slideway and the second slideway can be connected to each other to form the continuous slideway.

6. The rotating assembly according to claim 1, wherein an inner wall of the rotating shaft through-hole is provided with a third limiting platform; and
the third limiting platform is configured in such a way that the third limiting platform restrains the swing arm from rotating in an original direction when the rotation angle of the swing arm changes from the minimum angle of the second angle range to a maximum angle of the second angle range.

7. The rotating assembly according to claim 6, wherein when the rotation angle of the swing arm is the maximum angle of the second angle range, the third limiting platform is in contact with the swing arm.

8. The rotating assembly according to claim 6, wherein an outer surface of the rotating shaft is provided with a fourth limiting platform, and the fourth limiting platform and the third limiting platform are located in a same circumferential direction;
an arc length distance between the third limiting platform and the fourth limiting platform is greater than or equal to an arc length distance between the third limiting platform and the swing arm; and
when the rotation angle of the swing arm is the maximum angle of the second angle range, the third limiting platform is in contact with the fourth limiting platform.

9. The rotating assembly according to claim 1, wherein the first slideway is located at a position that is in the rotating shaft through-hole and that is far away from the swing arm.

10. The rotating assembly according to claim 1, wherein the rotating shaft comprises an assembly column and two support columns;
the assembly column is located between the two support columns, the assembly column and the two support columns are coaxial, and the second slideway runs through the assembly column;
the rotating shaft through-hole comprises a first-section through-hole and two second-section through-holes, wherein the first-section through-hole matches the assembly column, and the second-section through-holes match the support columns; and the assembly column is located in the first-section through-hole, and the support columns are located in the second-section through-holes.

11. The rotating assembly according to claim 1, wherein two rotating shaft and two swing arms are provided;
   a first side portion and a second side portion of the base are each provided with the rotating shaft through-hole and the first slideway;
   the two rotating shafts are located in the rotating shaft through-hole of the first side portion and the rotating shaft through-hole of the second side portion respectively; and
   the two swing arms are located in the continuous slideway of the first side portion and the continuous slideway of the second side portion respectively.

12. The rotating assembly according to claim 1, wherein the maximum angle of the first angle range is equal to the minimum angle of the second angle range.

13. A foldable mechanism, wherein the foldable mechanism comprises a door plate and the rotating assembly according to claim 1; and
   the door plate is located on a surface of the body connecting portion of the swing arm, and is configured to support a screen of a foldable terminal at which the foldable mechanism is located.

14. The foldable mechanism according to claim 13, wherein the foldable mechanism further comprises a fastener, a limiting pin, a connecting plate, and a connecting shaft, wherein
   the fastener is located on an end portion of the base of the rotating assembly;
   the limiting pin is located on a surface of the door plate, and a distance is reserved between the limiting pin and the door plate; and
   one side of the connecting plate is connected to the fastener by using the connecting shaft, the other side of the connecting plate is inserted between the limiting pin and the door plate, and the connecting plate is slidable in a direction perpendicular to the connecting shaft relative to the door plate.

15. A foldable terminal, wherein the foldable terminal comprises a first body, a second body, a screen, and the foldable mechanism according to claim 13; and
   the foldable mechanism is connected between the first body and the second body, and the screen is located on surfaces of the first body, the second body, and the foldable mechanism, and is fastened to the first body and the second body.

* * * * *